United States Patent
Shikama et al.

(10) Patent No.: US 10,677,858 B2
(45) Date of Patent: Jun. 9, 2020

(54) MAGNETIC SENSOR, A MAGNETIC DETECTION APPARATUS, AND A MAGNETIC DETECTION METHOD

(71) Applicant: Asahi Kasei Microdevices Corporation, Tokyo (JP)

(72) Inventors: Takahisa Shikama, Tokyo (JP); Takaaki Furuya, Tokyo (JP)

(73) Assignee: Asahi Kasei Microdevices Corporation, Tokyo (JP)

( * ) Notice: Subject to any disclaimer, the term of this patent is extended or adjusted under 35 U.S.C. 154(b) by 196 days.

(21) Appl. No.: 15/939,284

(22) Filed: Mar. 29, 2018

(65) Prior Publication Data

US 2018/0217212 A1 Aug. 2, 2018

Related U.S. Application Data

(63) Continuation of application No. PCT/JP2016/078960, filed on Sep. 29, 2016.

(30) Foreign Application Priority Data

Sep. 30, 2015 (JP) .................................. 2015-193761

(51) Int. Cl.
*G01R 33/07* (2006.01)
*H01L 43/06* (2006.01)
*H01L 43/14* (2006.01)

(52) U.S. Cl.
CPC ........... *G01R 33/07* (2013.01); *G01R 33/072* (2013.01); *H01L 43/065* (2013.01); *H01L 43/14* (2013.01)

(58) Field of Classification Search
CPC ...... G01R 33/07; G01R 33/072; H01L 43/065
See application file for complete search history.

(56) References Cited

U.S. PATENT DOCUMENTS

| 3,794,930 | A | * | 2/1974 | Dorey | H03F 1/303 330/10 |
| 5,155,643 | A | | 10/1992 | Jones, Jr. et al. | |
| 5,614,754 | A | * | 3/1997 | Inoue | H01L 43/065 257/421 |
| 2008/0157286 | A1 | | 7/2008 | Iwaki | |
| 2009/0284256 | A1 | | 11/2009 | Butzmann | |
| 2014/0070795 | A1 | | 3/2014 | Kolb et al. | |

FOREIGN PATENT DOCUMENTS

| JP | 2003185685 A | 7/2003 |
| JP | 2010050467 A | 3/2010 |

OTHER PUBLICATIONS

International Search Report for International Patent Application No. PCT/JP2016/078960, issued by the Japan Patent Office dated Dec. 13, 2016.

* cited by examiner

*Primary Examiner* — Reena Aurora

(57) ABSTRACT

To downsize a magnetic sensor by reducing the number of terminals of the magnetic sensor. A magnetic sensor to detect a magnetic field is provided, including: a drive terminal; a first output terminal; a second output terminal; and a magnetic sensing unit in which a first conduction path through which a driving current flows between the drive terminal and the first output terminal and a second conduction path through which a driving current flows between the drive terminal and the second output terminal are formed integrally. The magnetic sensing unit may have a first extending unit extending to the first output terminal and a second extending unit extending to the second output terminal.

9 Claims, 20 Drawing Sheets

MAGNETIC SENSOR, A MAGNETIC DETECTION APPARATUS, AND A MAGNETIC DETECTION METHOD

The contents of the following Japanese patent application(s) are incorporated herein by reference:
NO. 2015-193761 filed in JP on Sep. 30, 2015, and
NO. PCT/JP2016/078960 filed on Sep. 29, 2016.

BACKGROUND

1. Technical Field

The present invention relates to a magnetic sensor, a magnetic detection apparatus and a magnetic detection method.

2. Related Art

As a representative example of magnetic sensors applied to many magnetic sensor products such as current sensing apparatuses or position sensing apparatuses, there have conventionally been Hall elements utilizing the Hall effect. A Hall element generally has: a magnetic sensing unit; a current electrode pair for causing current to flow through the magnetic sensing unit; and an output electrode pair for sensing Hall electromotive force. Then, the magnitude, orientation and so on of magnetism applied to the magnetic sensing unit are sensed based on a Hall electromotive force signal sensed by the output electrode pair (please see Patent Document 1). Also, a Hall element described in Patent Document 2 has four terminals or more, and reduces an output offset.

[Patent Document 1] Japanese Patent Application Publication No. 2010-050467
[Patent Document 2] United States Patent Application Publication No. 2014/0070795

SUMMARY

In recent years, downsizing of magnetic sensors is required. Because conventional Hall elements have a structure that necessarily requires at least four terminals or more, it has been difficult to scale down or downsize the chip size by reduction of the area of a magnetic sensor. The present invention has been made in view of such drawbacks, and an object of the present invention is to provide a magnetic sensor that allows reduction of the number of terminals.

General Disclosure (Item 1)
A magnetic detection apparatus may include a first current source connected to a first terminal of a magnetic sensing unit that has the first terminal, a second terminal and a third terminal. The magnetic detection apparatus may include a second current source connected to the second terminal of the magnetic sensing unit. The magnetic detection apparatus may include an output unit that outputs a magnetic detection signal corresponding to a difference between a voltage on the first terminal side of the magnetic sensing unit and a voltage on the second terminal side of the magnetic sensing unit.

(Item 2)
The first current source and the second current source may perform adjustment such that a current to be caused to flow between the first current source and the magnetic sensing unit and a current to be caused to flow between the second current source and the magnetic sensing unit are made close to each other.

(Item 3)
The first current source and the second current source may be constituted by a current mirror circuit.

(Item 4)
The magnetic detection apparatus may include the magnetic sensing unit. The magnetic sensing unit may: be formed integrally; and has: a first extending unit extending to the first terminal and a second extending unit extending to the second terminal.

(Item 5)
The magnetic sensing unit may have a trifurcate shape. The first extending unit may be provided to a first branch portion of the trifurcate shape. The second extending unit may be provided to a second branch portion of the trifurcate shape. The third terminal may be provided to a third extending portion extending at a third branch portion of the trifurcate shape.

(Item 6)
The magnetic sensing unit may be formed in a semiconductor substrate. Respective sides constituting outer circumference of the magnetic sensing unit may be provided in cleavage directions of a (111) plane of the semiconductor substrate.

(Item 7)
A magnetic detection apparatus may include a magnetic sensing unit having a first terminal, a second terminal and a third terminal. The magnetic detection apparatus may include an output unit that outputs a magnetic detection signal based on outputs from two terminals that are among the first terminal, second terminal and third terminal of the magnetic sensing unit and are used as sense terminals. The magnetic detection apparatus may include a switching unit that performs switching to select any of the terminals of the magnetic sensing unit that is to be connected to the output unit.

(Item 8)
The output unit may output the magnetic detection signal based on: a first output difference between the first terminal and the second terminal that is obtained if the first terminal and the second terminal are used as the two sense terminals; a second output difference between the second terminal and the third terminal that is obtained if the second terminal and the third terminal are used as the two sense terminals; and a third output difference between the third terminal and the first terminal that is obtained if the third terminal and the first terminal are used as the two sense terminals.

(Item 9)
The magnetic detection apparatus may include a first current source connected to a first sense terminal among the two sense terminals. The magnetic detection apparatus may include a second current source connected to a second sense terminal among the two sense terminals. The output unit may output a magnetic detection signal corresponding to a difference between a voltage of the first sense terminal side of the magnetic sensing unit and a voltage of the second sense terminal side of the magnetic sensing unit.

(Item 10)
The magnetic detection apparatus may include a driving power source connected to the magnetic sensing unit. The output unit may output a magnetic detection signal corresponding to a difference between a current on one side of the two sense terminals of the magnetic sensing unit and a current on the other side of the two sense terminals of the magnetic sensing unit.

(Item 11)

A magnetic sensor may be a magnetic sensor to detect a magnetic field. The magnetic sensor may include a drive terminal, a first output terminal and a second output terminal. The magnetic sensor may include a magnetic sensing unit in which a first conduction path through which a driving current flows between the drive terminal and the first output terminal and a second conduction path through which a driving current flows between the drive terminal and the second output terminal are formed integrally.

(Item 12)

The magnetic sensing unit may have a first extending unit extending to the first output terminal and a second extending unit extending to the second output terminal.

(Item 13)

The magnetic sensing unit may have a trifurcate shape. The first extending unit may be provided to a first branch portion of the trifurcate shape, the second extending unit may be provided to a second branch portion of the trifurcate shape, and the drive terminal may be provided to a third extending portion extending in a third branch portion of the trifurcate shape.

(Item 14)

The first output terminal and the second output terminal may generate an output difference corresponding to a magnetic field applied to the magnetic sensing unit.

(Item 15)

The magnetic sensor may further include a semiconductor substrate on which the magnetic sensing unit is formed. Respective sides constituting outer circumference of the magnetic sensing unit may be provided in cleavage directions of a (111) plane of the semiconductor substrate.

(Item 16)

A magnetic detection apparatus may include a driving current supply unit that supplies a driving current to a drive terminal at a magnetic sensing unit in which a first conduction path between the drive terminal and a first output terminal and a second conduction path between the drive terminal and a second output terminal are formed integrally. The magnetic detection apparatus may include a magnetic detection unit that detects a magnetic field applied to the magnetic sensing unit based on outputs of the first output terminal and the second output terminal.

(Item 17)

The magnetic detection unit may detect a magnetic field based on a first current flowing through the first output terminal and a second current flowing through the second output terminal.

(Item 18)

The magnetic detection unit may detect a magnetic field based on a difference between the first current and the second current.

(Item 19)

The driving current supply unit may supply a predetermined driving current to both the first conduction path and the second conduction path. The magnetic detection unit may detect a magnetic field based on a first voltage of the first output terminal and a second voltage of the second output terminal.

(Item 20)

The driving current supply unit may perform adjustment such that a first driving current flowing through the first conduction path and a second driving current flowing through the second conduction path are made close to each other. The magnetic detection unit may detect a magnetic field based on a difference between the first voltage and the second voltage.

(Item 21)

A magnetic detection method may include supplying a driving current to a first terminal of a magnetic sensing unit that has the first terminal, a second terminal and a third terminal. The magnetic detection method may include detecting a magnetic field applied to the magnetic sensing unit based on a difference between output currents of the second terminal and the third terminal.

(Item 22)

A magnetic detection method may be a magnetic detection method to detect an input magnetic field by a magnetic sensing unit that has a first terminal, a second terminal and a third terminal. The magnetic detection method may include supplying equal driving currents to between the first terminal and the second terminal and between the first terminal and the third terminal. The magnetic detection method may include detecting the input magnetic field based on a potential difference between the second terminal and the third terminal.

(Item 23)

In the magnetic sensing unit, a first conduction path between the first terminal and the second terminal and a second conduction path between the first terminal and the third terminal may be formed integrally.

(Item 24)

The magnetic sensor may include a magnetic sensing unit. The magnetic sensing unit may have: a middle portion; a first extending unit extending from the middle portion in a first direction when seen in a top view; a second extending unit extending from the middle portion in a second direction which is different from the first direction when seen in a top view; and a third extending portion extending from the middle portion in a third direction which is different from the first direction and second direction when seen in a top view. Each side at end portions of the first extending unit, second extending unit and third extending portion may be provided in any direction among the first direction, the second direction and the third direction. The magnetic sensor may include a first output terminal formed in the first extending unit of the magnetic sensing unit. The magnetic sensor may include a second output terminal formed in the second extending unit of the magnetic sensing unit. The magnetic sensor may include a drive terminal formed in the third extending portion of the magnetic sensing unit.

(Item 25)

The magnetic sensor may further include a semiconductor substrate on which the magnetic sensing unit is formed. Respective sides constituting outer circumference of the magnetic sensing unit may be provided in cleavage directions of a (111) plane of the semiconductor substrate.

(Item 26)

Respective sides constituting outer circumference of the magnetic sensing unit may be provided in any direction among the first direction, the second direction and the third direction.

(Item 27)

The first direction, the second direction and the third direction may be directions that are different from each other by 120 degrees.

The summary clause does not necessarily describe all necessary features of the embodiments of the present invention. The present invention may also be a sub-combination of the features described above.

DESCRIPTION OF EXEMPLARY EMBODIMENTS

Hereinafter, (some) embodiment(s) of the present invention will be described. The embodiment(s) do(es) not limit the invention according to the claims, and all the combinations of the features described in the embodiment(s) are not necessarily essential to means provided by aspects of the invention.

Figure 1:
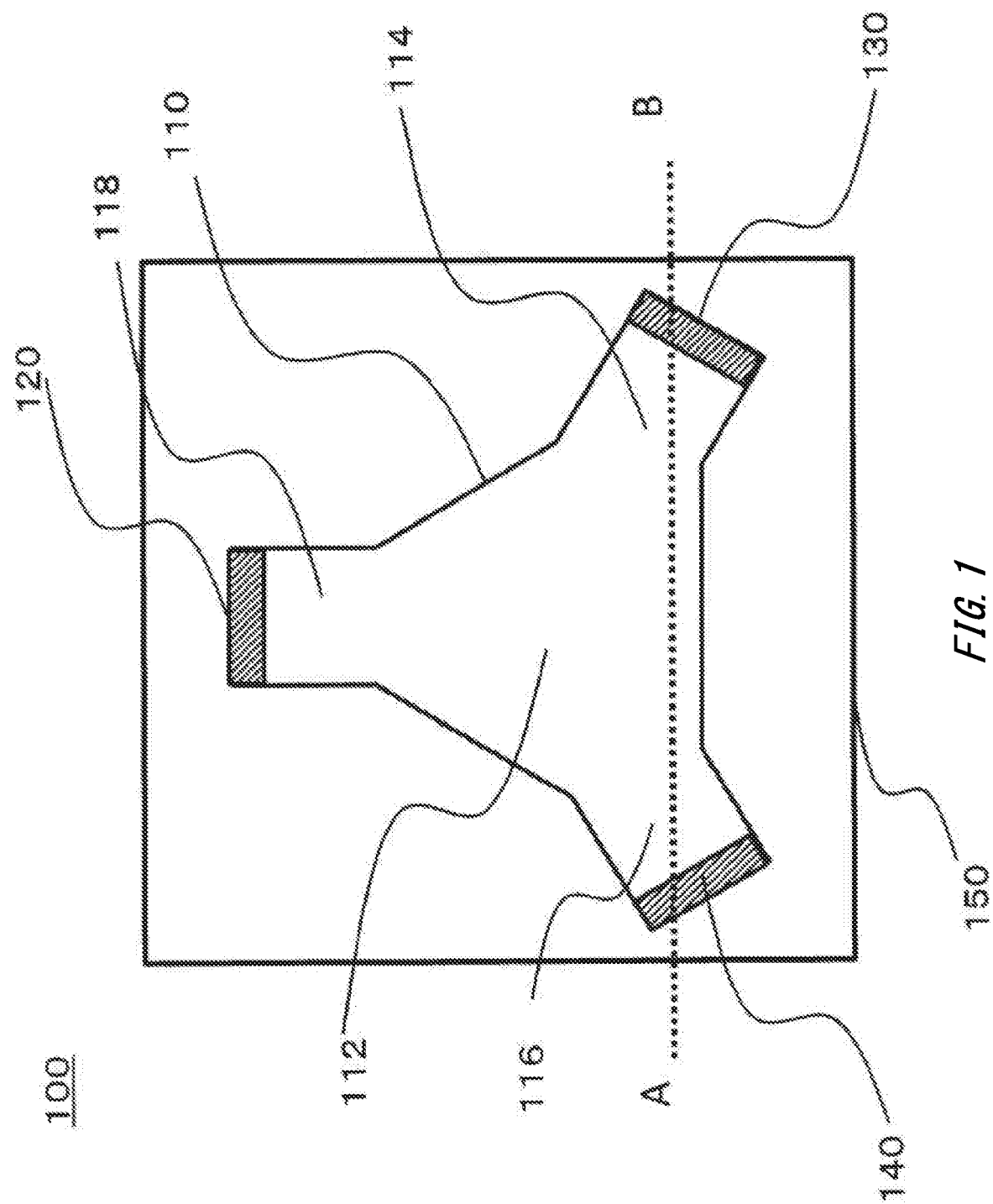
FIG. 1 shows a schematic top view of a magnetic sensor 100 in a first example in the present embodiment.
Figure 2:
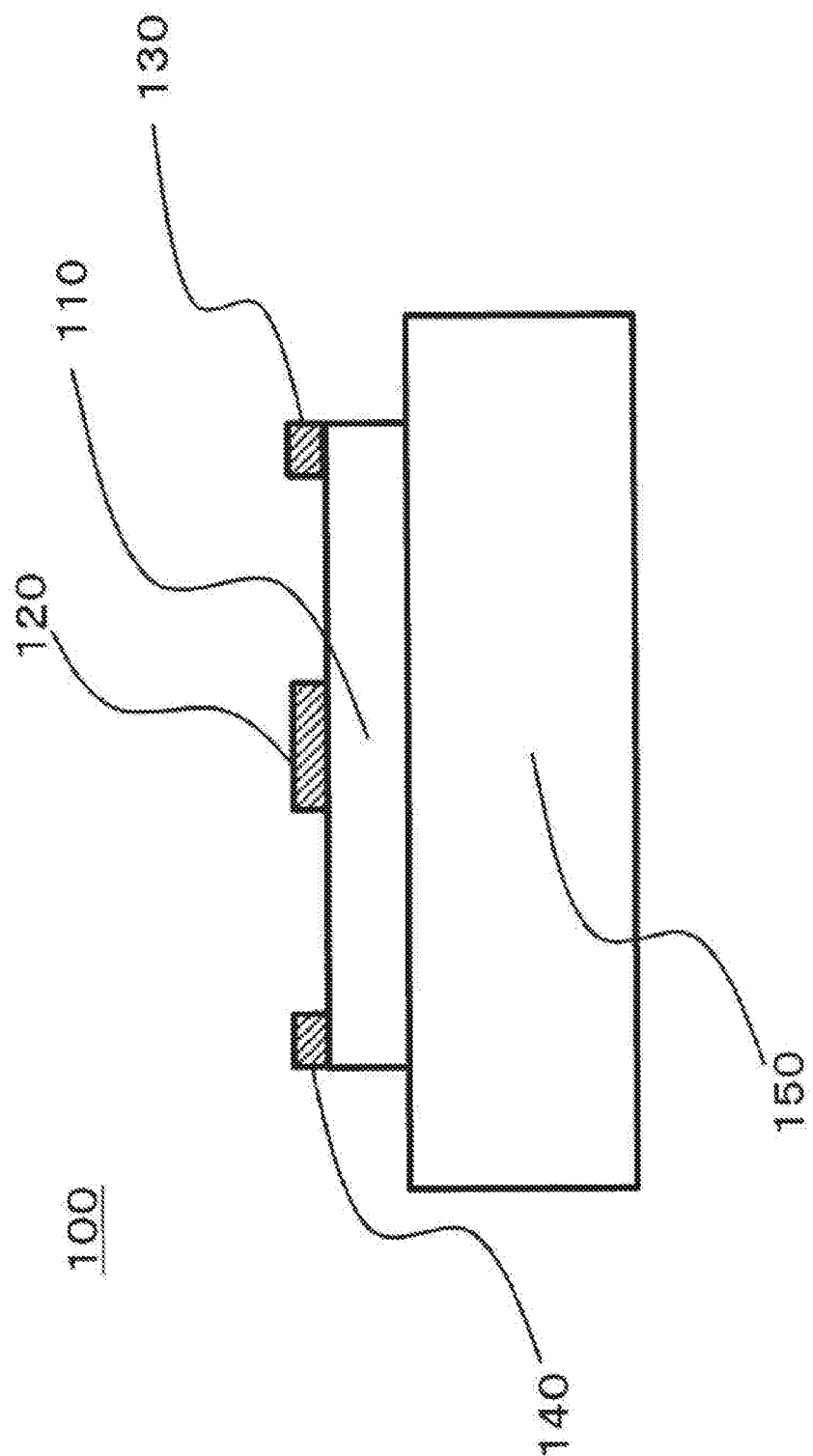
FIG. 2 shows a schematic view of a cross section of the magnetic sensor 100 of the first example in the present embodiment.

FIG. 1 shows a schematic top view of a magnetic sensor 100 of a first example in the present embodiment, and FIG. 2 shows a schematic view of a cross section of the magnetic sensor 100 in FIG. 1 taken along A-B. The magnetic sensor 100 may be a Hall element, for example, and allows, using less than four terminals, output of a current or voltage corresponding to a magnetic field applied from the outside. The magnetic sensor 100 includes a magnetic sensing unit 110, a first terminal 120, a second terminal 130, a third terminal 140 and a substrate 150. As one example, the first terminal 120 is the drive terminal, the second terminal 130 is a first output terminal, and the third terminal 140 is a second output terminal.

The magnetic sensing unit 110 is provided on the substrate 150, and thereon, a first conduction path through which a driving current flows between the drive terminal 120 and the first output terminal 130 and a second conduction path through which a driving current flows between the drive terminal 120 and the second output terminal 140 are formed integrally. The magnetic sensing unit 110 is a portion to which a magnetic field is applied, and a Lorentz force corresponding to the applied magnetic field is generated to a driving current flowing through the first conduction path and the second conduction path in the magnetic sensing unit 110, and the driving currents change accordingly. The magnetic sensing unit 110 may have a shape in which positions where the drive terminal 120, the first output terminal 130 and the second output terminal 140 are arranged at the vertexes of a triangle, and may be a trifurcate shape, a concave shape, a rectangular shape, a V-shape, a triangle or the like.

The magnetic sensing unit 110 of the magnetic sensor 100 of the first example in FIG. 1 has axes of three-fold symmetry in a planar view (three rotational axes), and has a trifurcate shape. The magnetic sensing unit 110 may have: a middle portion 112, a first extending unit 114 extending from the middle portion 112 to the first output terminal 130; a second extending unit 116 extending to the second output terminal 140; and a third extending portion 118 extending to the drive terminal 120. In this case, the first extending unit 114 may be provided to a first branch portion of the trifurcate shape, the second extending unit 116 may be provided to a second branch portion of the trifurcate shape, and the third extending portion 118 may be provided to a third branch portion of the trifurcate shape. The drive terminal 120, the first output terminal 130 and the second output terminal 140 may be formed only at parts of sides at the end portions of the magnetic sensing unit 110. Other examples of the shape of the magnetic sensing unit 110 of the magnetic sensor 100 are mentioned below with reference to FIGS. 5 to 10.

The drive terminal 120 is provided to the third extending portion 118, and supplied with a driving current from the outside. The first output terminal 130 is provided to the first extending unit 114, and outputs a driving current to flow through the first conduction path between the drive terminal 120 and the first output terminal 130. The second output terminal 140 is provided to the second extending unit 116, and outputs a driving current to flow through the second conduction path between the drive terminal 120 and the second output terminal 140. For example, if a driving current is supplied such that an output of the first output terminal 130 and an output of the second output terminal 140 become equal to each other, upon application of a magnetic field to the magnetic sensing unit 110, the first output terminal 130 and the second output terminal 140 can generate an output difference corresponding to the magnetic field applied to the magnetic sensing unit 110.

The magnetic sensing unit 110 is formed on the substrate 150 directly or with an insulating layer or the like being interposed therebetween, and the substrate 150 may be a semiconductor substrate, an insulating substrate or the like. The semiconductor substrate may be a silicon substrate, a compound semiconductor substrate or the like, and the insulating substrate may be a ceramic substrate or the like. An electric circuit may be formed in or on the substrate 150.

Figure 3:
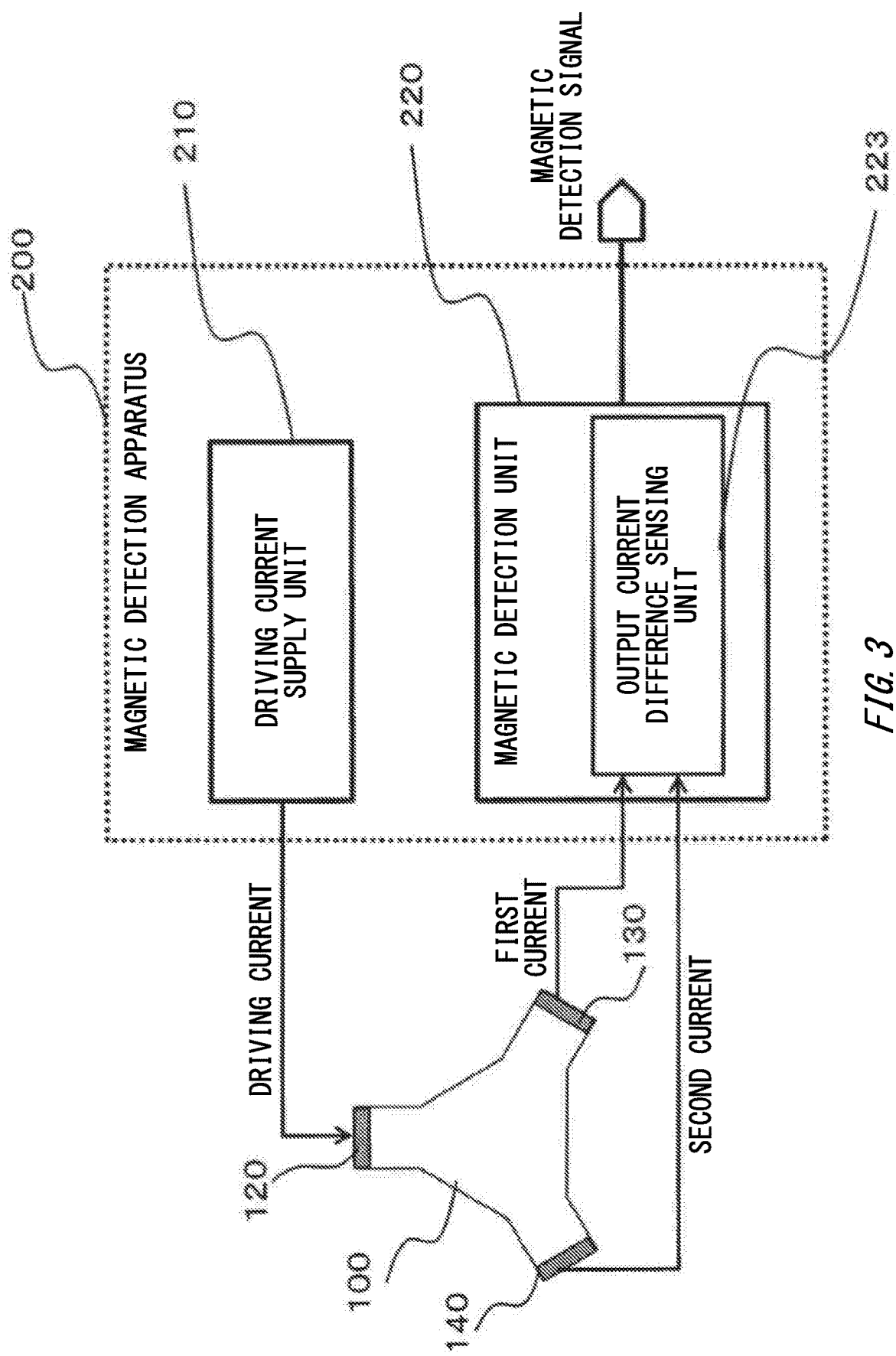
FIG. 3 shows a magnetic detection apparatus 200 of the first example according to the present embodiment.

FIG. 3 shows a magnetic detection apparatus 200 of the first example according to the present embodiment. The magnetic detection apparatus 200 supplies driving currents to the magnetic sensor 100, and outputs a magnetic detection signal corresponding to an output of the magnetic sensor 100. The magnetic detection apparatus 200 includes a driving current supply unit 210 and a magnetic detection unit 220. By performing switching to switch terminals to be supplied with driving currents and terminals to output output currents at a chopper frequency, noise components in output signals can be modulated to a high frequency side (chopper frequency). It becomes possible to eliminate the chopper-modulated noise components using a low-pass filter or the like in latter signal processing. Specific configuration examples include a configuration including a switch to switch between terminals and connect them and a control unit to switch the switch at a chopper frequency, between the drive terminal 120, first output terminal 130 and second output terminal 140 and the driving current supply unit 210 and magnetic detection unit 220.

The driving current supply unit 210 is electrically connected to the drive terminal 120 of the magnetic sensor 100 and supplies driving currents to the drive terminal 120. The driving current supply unit 210 can supply a driving current to the drive terminal 120 at a constant voltage or constant current.

The magnetic detection unit 220: is electrically connected to the first output terminal 130 and the second output terminal 140; measures output currents or output voltages of the first output terminal 130 and the second output terminal 140; and detects a magnetic field applied to the magnetic sensing unit 110 based on the measured output currents or output voltages.

The magnetic detection unit 220 includes an output current difference sensing unit 223. For example, the driving current supply unit 210 supplies driving currents such that in a situation where a magnetic field is not being applied to the magnetic sensing unit 110, a first current to flow through the first output terminal 130 and a second current to flow through the second output terminal 140 become approximately equal currents. The output current difference sensing unit 223 may detect a magnetic field based on a difference between the first current and second current output from the first output terminal 130 and second output terminal 140. In the following description, a method for the magnetic detection apparatus 200 to detect a magnetic field based on the first current flowing through the first output terminal 130 and the second current flowing through the second output terminal 140 is explained.

The driving current supply unit 210 of the magnetic detection apparatus 200 supplies driving currents such that in a situation where a magnetic field is not applied to the magnetic sensor 100, a first current to flow between the drive terminal 120 and the first output terminal 130 and a second current to flow between the drive terminal 120 and the second output terminal 140 become approximately equal currents. For example, the driving current supply unit 210 applies voltages between the drive terminal 120 and the first output terminal 130 and between the drive terminal 120 and the second output terminal 140, respectively, such that a first current $I_{1in}$ and a second current $I_{2in}$ to be supplied become equal currents $I_0$.

Then, assuming that the direction vertical to the magnetic sensing unit 110 of the magnetic sensor 100 is a first axis, for example, upon application of a magnetic field Bz from the first axis direction to the magnetic sensing unit 110, a Lorentz force acts on currents flowing in the first conduction path and second conduction path of the magnetic sensing unit 110 in a direction that is vertical to the directions in which the currents flow and is vertical to the direction in which the magnetic field is applied. As a result of this, in the magnetic sensor 100, a current to one side relative to the orientation of the Lorentz force increases, and as in Equations (1) and (2) shown below, a difference is generated between the value of a first current $I_{1out}$ output from the first output terminal 130 and the value of a second current $I_{2out}$ output from the second output terminal 140.

$$I_{1out} = I_0 + \alpha Bz \quad \text{(Equation 1)}$$

$$I_{2out} = I_0 - \alpha Bz \quad \text{(Equation 2)}$$

Here, α is a constant of proportionality, and is an amount determined based on the physical properties and shape of a material.

The output current difference sensing unit 223 measures the value of the first current $I_{1out}$ and the value of the second current $I_{2out}$, and calculates the difference between the output currents as in Equation (3) shown below. Thereby, it becomes possible for the output current difference sensing unit 223 to detect the magnetic field Bz in the direction vertical direction to the magnetic sensing unit 110. Also, it is possible, as well, to sense the orientation of the applied magnetic field Bz according to the plus or minus sign of the result calculated according to Equation (3). In this manner, according to a current difference between the first output terminal 130 and the second output terminal 140, the magnetic detection unit 220 can output a magnetic detection signal corresponding to the magnitude and/or orientation of a magnetic field being applied to the magnetic sensing unit 110.

$$I_{1out} - I_{2out} = 2\alpha Bz \quad \text{(Equation 3)}$$

Also, the driving current supply unit 210 may supply a driving current to the drive terminal 120 such that the first current and the second current become different from each other. In this case, the output current difference sensing unit 223 can also determine differences between the values of the first current $I_{1in}$ and second current $I_{2in}$ supplied by the driving current supply unit 210 and the values of the first current $I_{1out}$ and second current $I_{2out}$ output from the first output terminal 130 and second output terminal 140, respectively ($I_{1in}-I_{1out}$, $I_{2in}-I_{2out}$), and detect a magnetic field based on changes in the difference between the first currents and the difference between the second currents.

Figure 4:
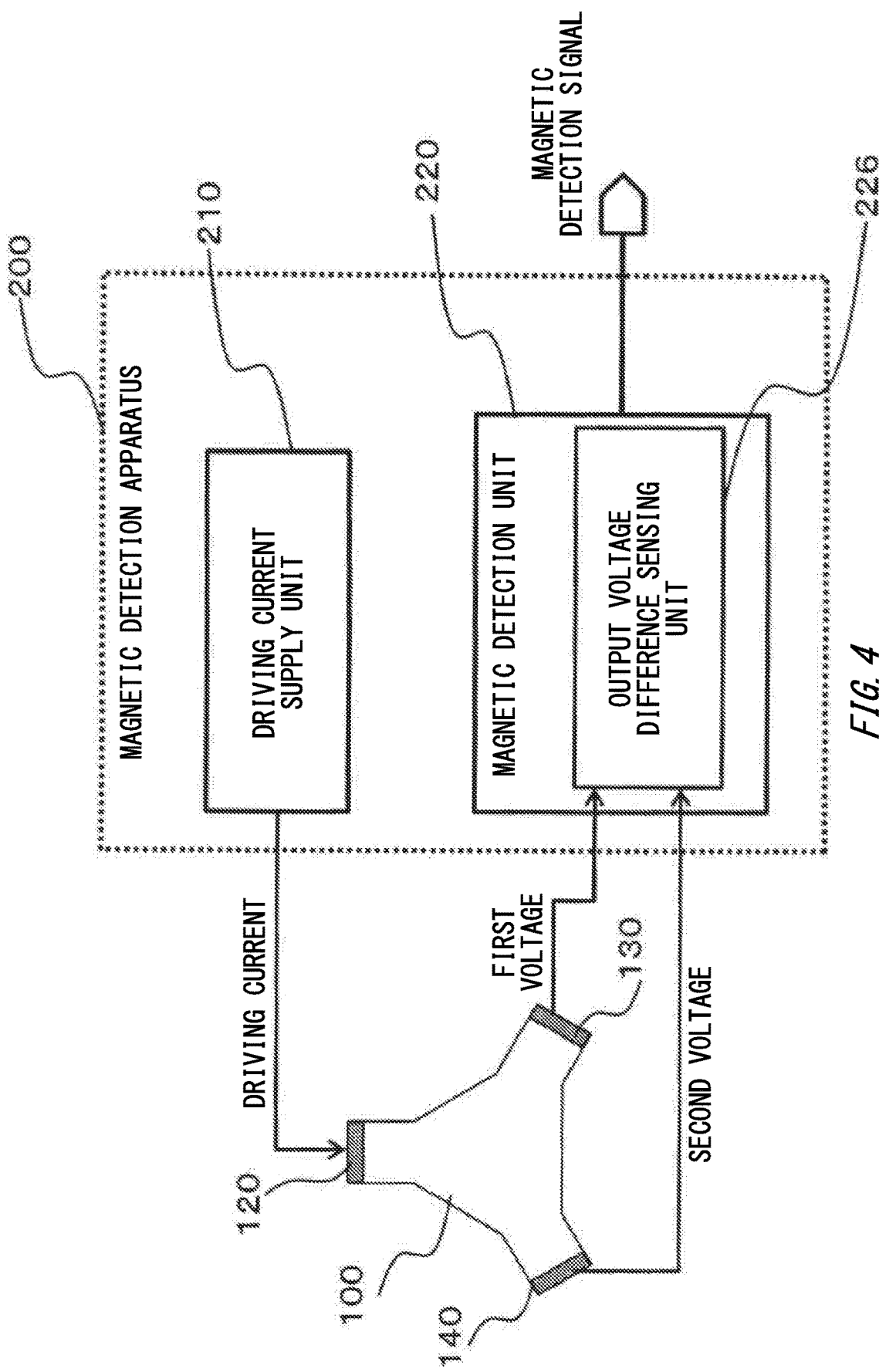
FIG. 4 shows the magnetic detection apparatus 200 of a second example according to the present embodiment.

FIG. 4 shows the magnetic detection apparatus 200 of a second example according to the present embodiment. The magnetic detection apparatus 200 of the second example detects a magnetic field based on a first voltage of the first output terminal 130 and a second voltage of the second output terminal 140. The magnetic detection unit 220 of the magnetic detection apparatus 200 of the second example includes an output voltage difference sensing unit 226.

In the magnetic detection apparatus 200 of the second example, the driving current supply unit 210 supplies a predetermined driving current to both the first conduction path and the second conduction path. For example, the driving current supply unit 210 performs adjustment such that a first driving current flowing through the first conduction path and a second driving current flowing through the second conduction path are made close to each other. As one example, the driving current supply unit 210 may have a constant current source that is connected to both the first output terminal 130 and the second output terminal 140 and causes equal currents to flow therethrough (a current mirror circuit, etc.). Specifically, the driving current supply unit 210 regulates a voltage between the drive terminal 120 and the first output terminal 130 and a voltage between the drive terminal 120 and the second output terminal 140, respectively, such that the first driving current and the second driving current become equal to each other. Thereby, if a magnetic field is applied to the magnetic sensing unit 110 and a Lorentz force acts on the first driving current and the second driving current, the driving currents should naturally change, but the driving current supply unit 210 changes a voltage between the drive terminal 120 and the first output terminal 130 and a voltage between the drive terminal 120 and the second output terminal 140, respectively, so as to keep the driving currents constant.

In response to this, the output voltage difference sensing unit 226 of the magnetic detection unit 220 may detect a magnetic field based on a difference between the first voltage of the first output terminal 130 and the second voltage of the second output terminal 140. The output voltage difference sensing unit 226 measures the first voltage of the first output terminal 130 and the second voltage of the second output terminal 140, and senses a difference between the first voltage and the second voltage that is generated because the first driving current and the second driving current are made close to each other. According to the voltage difference, the magnetic detection unit 220 can output a magnetic detection signal corresponding to the magnitude and/or orientation of a magnetic field being applied to the magnetic sensing unit 110.

In the above-mentioned description, the magnetic detection apparatus 200 and the drive terminal 120, first output terminal 130 and second output terminal 140 of the magnetic sensor 100 may be electrically connected using wire bonding, metallic wires for semiconductor processes, or the like.

With the magnetic sensor 100 and magnetic detection apparatus 200 of the present embodiment as mentioned above, the number of terminals of the magnetic sensor 100 can be reduced to three, and the chip size can be reduced.

FIG. 5 to FIG. 10 show schematic top views of the magnetic sensor 100 of a second example to a seventh example in the present embodiment. Configurations of the magnetic sensor 100 of the second example to the seventh example that are approximately the same as configurations of the magnetic sensor 100 according to the present embodiment shown in FIG. 1 are given the same reference symbols, and explanation thereof is omitted.

Figure 5:
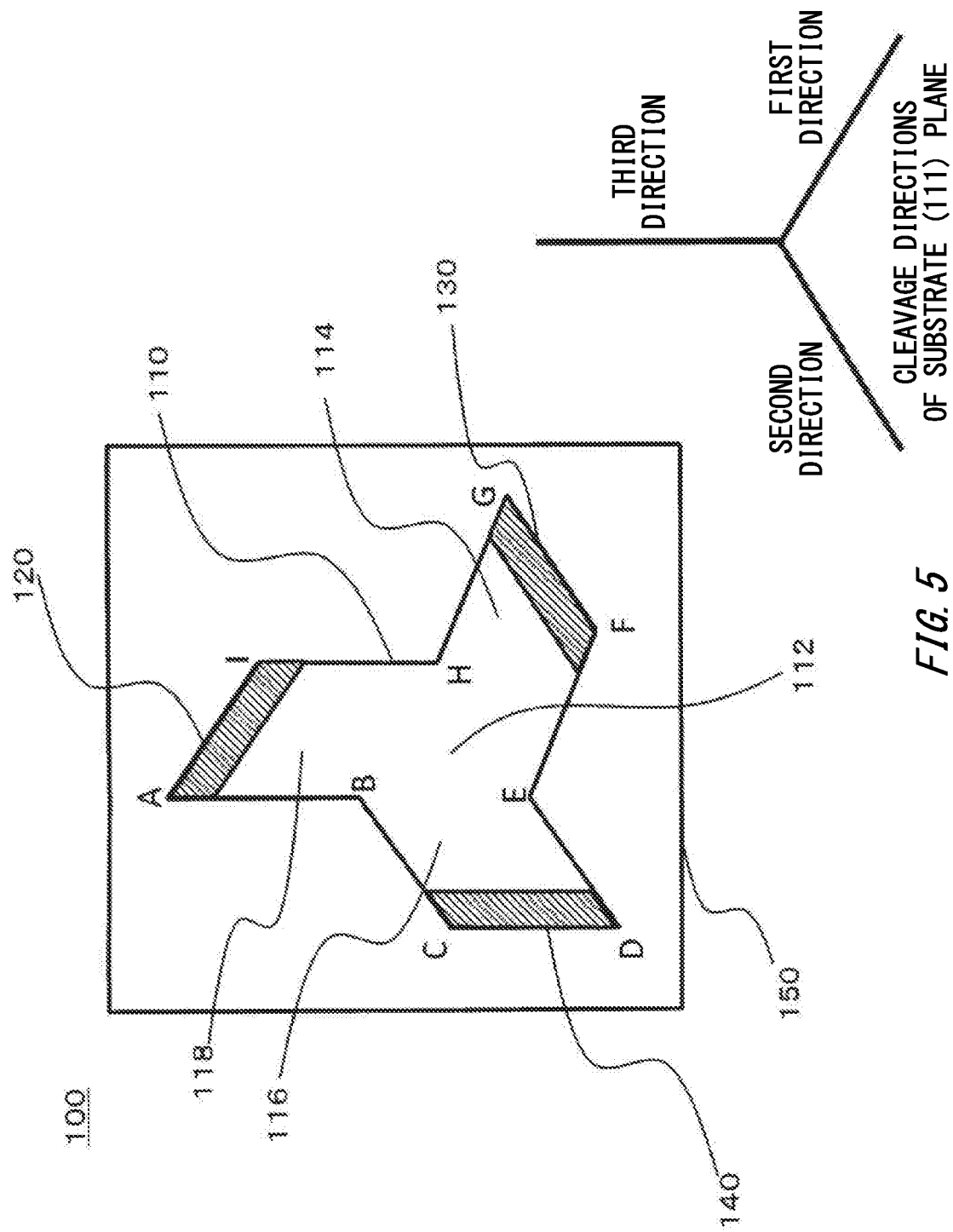
FIG. 5 shows a schematic top view of the magnetic sensor 100 of the second example in the present embodiment.

In the magnetic sensor 100 of the second example shown in FIG. 5, the magnetic sensing unit 110 is configured according to the cleavage directions on the (111) plane of the semiconductor substrate 150. The magnetic sensing unit 110 of the magnetic sensor 100 has: the middle portion 112; the first extending unit 114 extending from the middle portion 112 in a first direction when seen in a top view; the second extending unit 116 extending from the middle portion 112 in a second direction which is different from the first direction when seen in a top view; and the third extending portion 118 extending from the middle portion 112 in a third direction which is different from the first direction and second direction when seen in a top view. Each side at the end portions of the first extending unit 114, second extending unit 116 and third extending portion 118 is provided in any direction among the first direction, the second direction and the third direction. As one example, the first direction to the third direction are provided in the cleavage directions on the (111) plane of the semiconductor substrate 150. The first output terminal 130 is formed at the first extending unit 114 of the magnetic sensing unit 110, the second output terminal 140 is formed at the second extending unit 116, and the drive terminal 120 is formed at the third extending portion 118.

Respective sides FG, CD, AI of the end portions of the first extending unit 114, second extending unit 116 and third extending portion 118 may be provided in the cleavage directions on the (111) plane of the semiconductor substrate 150. If the first direction is rotated by a first angle, it may become the second direction, and if the second direction is rotated by a second angle, it may become the third direction. In the magnetic sensor 100 of the second example in FIG. 5, the first angle and the second angle are 60 degrees, and the first direction, the second direction and the third direction are directions that are different from each other by 120 degrees. The interior angles of the magnetic sensing unit 110 are all integer multiples of 60 degrees, and ∠ABC=∠DEF=∠GHI=240 degrees, ∠BCD=∠EFG=∠HIA=120 degrees and ∠IAB=∠CDE=∠FGH=60 degrees.

In the magnetic sensing unit 110, not only the sides at the end portions of the first extending unit 114, second extending unit 116 and third extending portion 118, but also respective sides constituting the outer circumference of the magnetic sensing unit 110 may be all provided in any direction among the first direction, the second direction and the third direction, and such a magnetic sensor 100 of the second example allows the etching rate at the time of forming the magnetic sensing unit 110 in manufacturing the magnetic sensor 100 to be equal in all the directions at the outer circumference of the magnetic sensing unit 110. Because of this, the magnetic sensing unit 110 can be formed easily no matter which etching approach is employed.

The magnetic sensing unit 110 of the magnetic sensor 100 may not be rotation-symmetric, and the first angle and the second angle are not limited to 60 degrees, but may be 40 degrees to 80 degrees.

Figure 6:
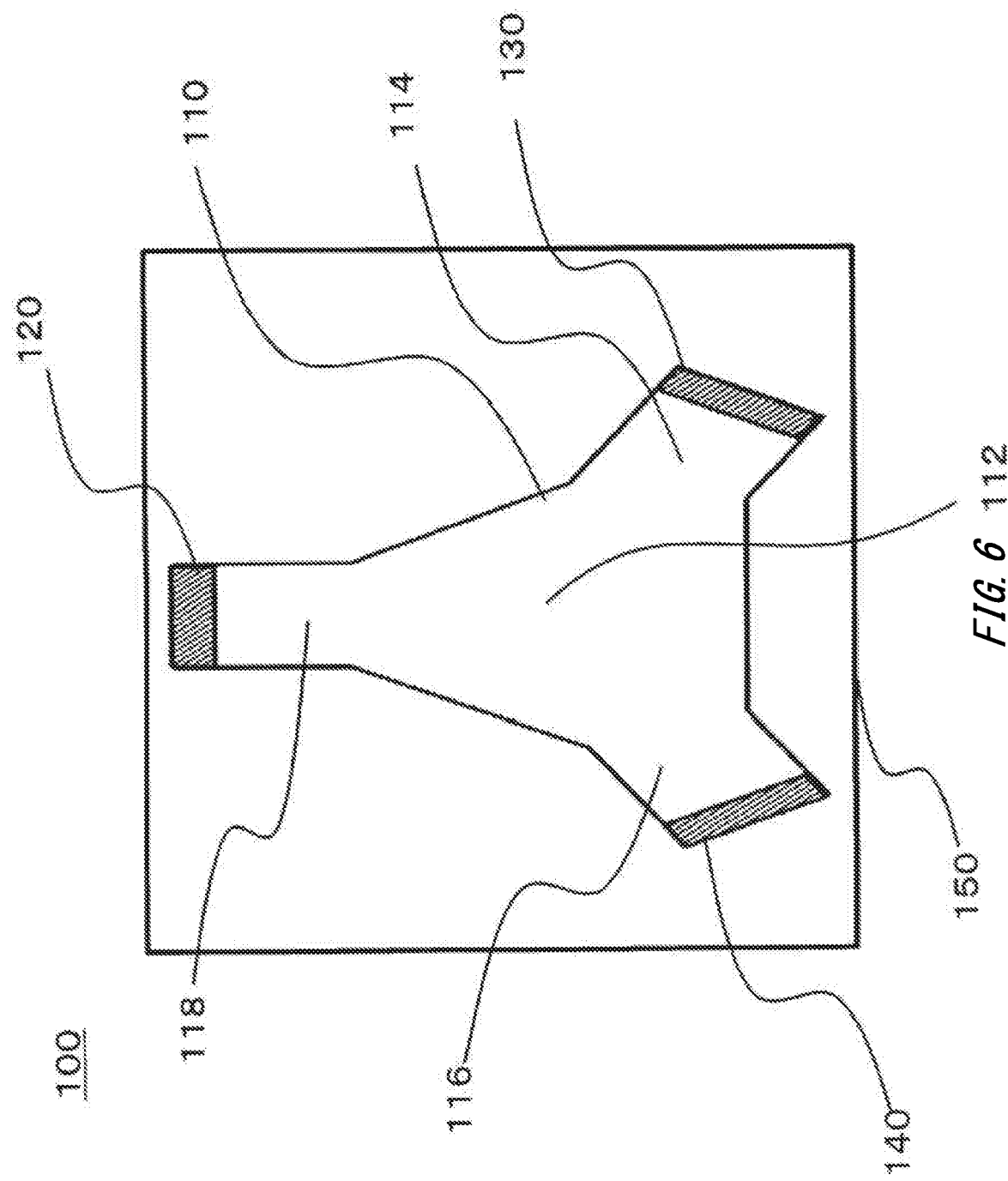
FIG. 6 shows a schematic top view of the magnetic sensor 100 of a third example in the present embodiment.

In the magnetic sensor 100 of the third example shown in FIG. 6, the distance between the drive terminal 120 and the first output terminal 130 and the distance between the drive terminal 120 and the second output terminal 140 are longer than the distance between the first output terminal 130 and the second output terminal 140. Also, the distance relationship between the respective terminals is not limited to such a relationship, but the distances between respective terminals may be different from each other.

Figure 7:
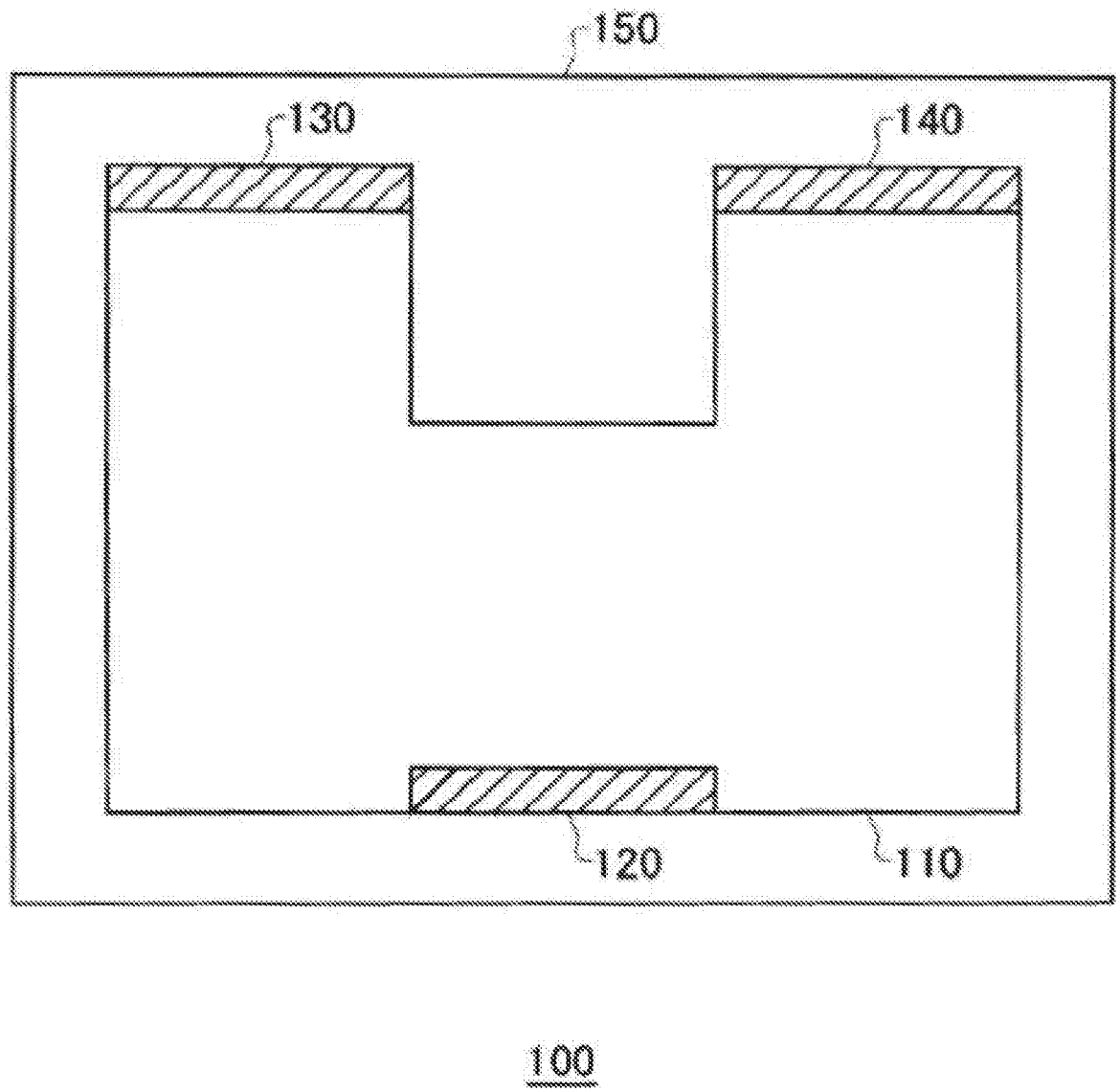
FIG. 7 shows a schematic top view of the magnetic sensor 100 of a fourth example in the present embodiment.

In the magnetic sensor 100 of the fourth example shown in FIG. 7, the magnetic sensing unit 110 has a concave shape, the first output terminal 130 and the second output terminal 140 are formed at two tips of the concave shape, respectively, and the drive terminal 120 is formed at a middle portion on a side opposite to the tips.

Figure 8:
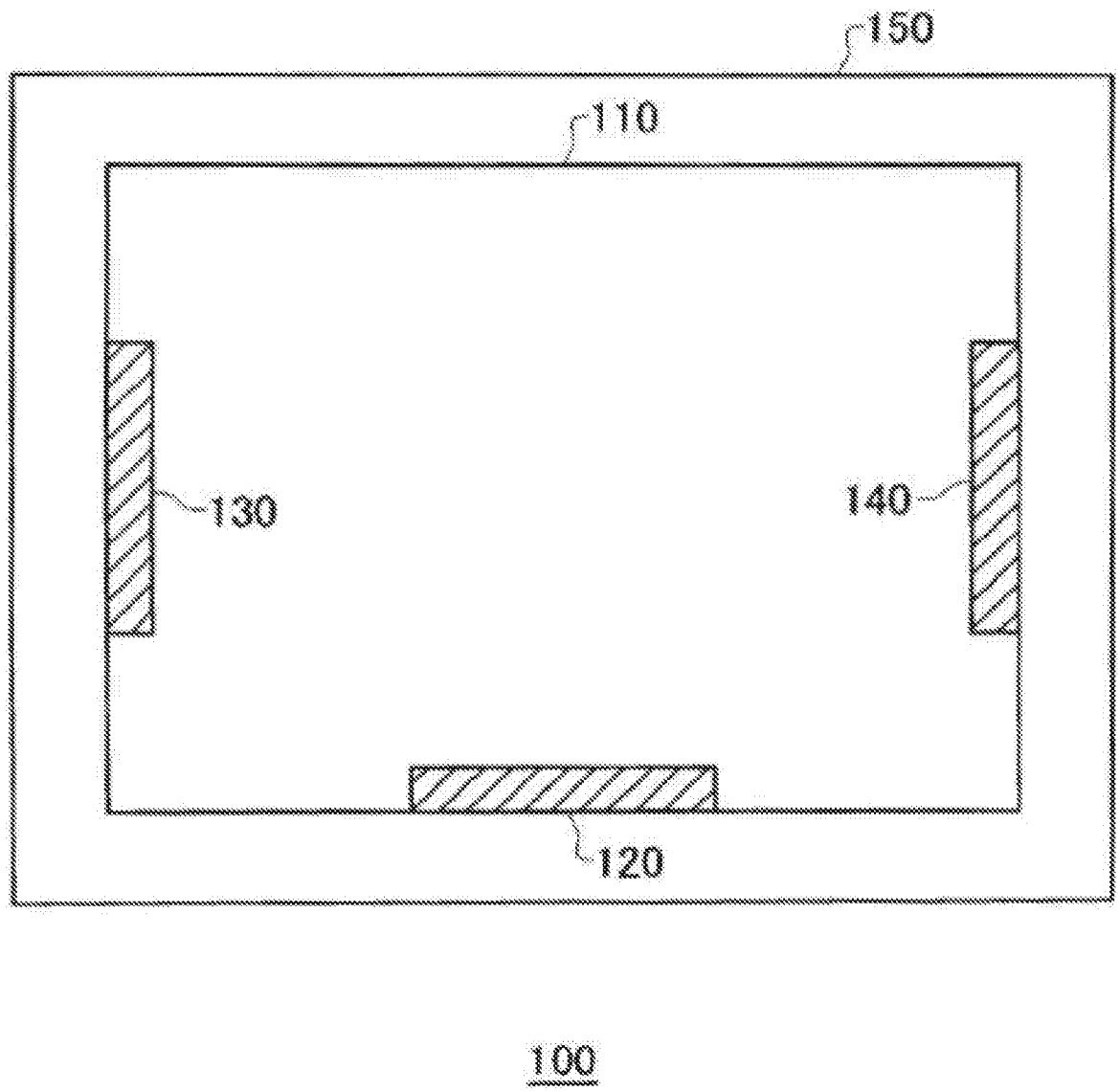
FIG. 8 shows a schematic top view of the magnetic sensor 100 of a fifth example in the present embodiment.

In the magnetic sensor 100 of the fifth example shown in FIG. 8, the magnetic sensing unit 110 has a rectangular shape, the first output terminal 130 and the second output terminal 140 are formed at mutually opposite sides, respectively, and the drive terminal 120 is formed on a side different from those two opposite sides.

In the magnetic sensor 100 of the fourth example and the fifth example shown in FIG. 7 and FIG. 8, external sides of the magnetic sensing unit 110 are formed in parallel with the cleavage directions on the (100) plane of the semiconductor substrate 150. Such a magnetic sensor 100 of the fourth example and the fifth example allows the etching rate at the time of forming the magnetic sensing unit 110 in manufacturing the magnetic sensor 100 to be equal in all the directions at the outer circumference of the magnetic sensing unit 110. Because of this, the magnetic sensing unit 110 is formed easily no matter which etching approach is employed.

Figure 9:
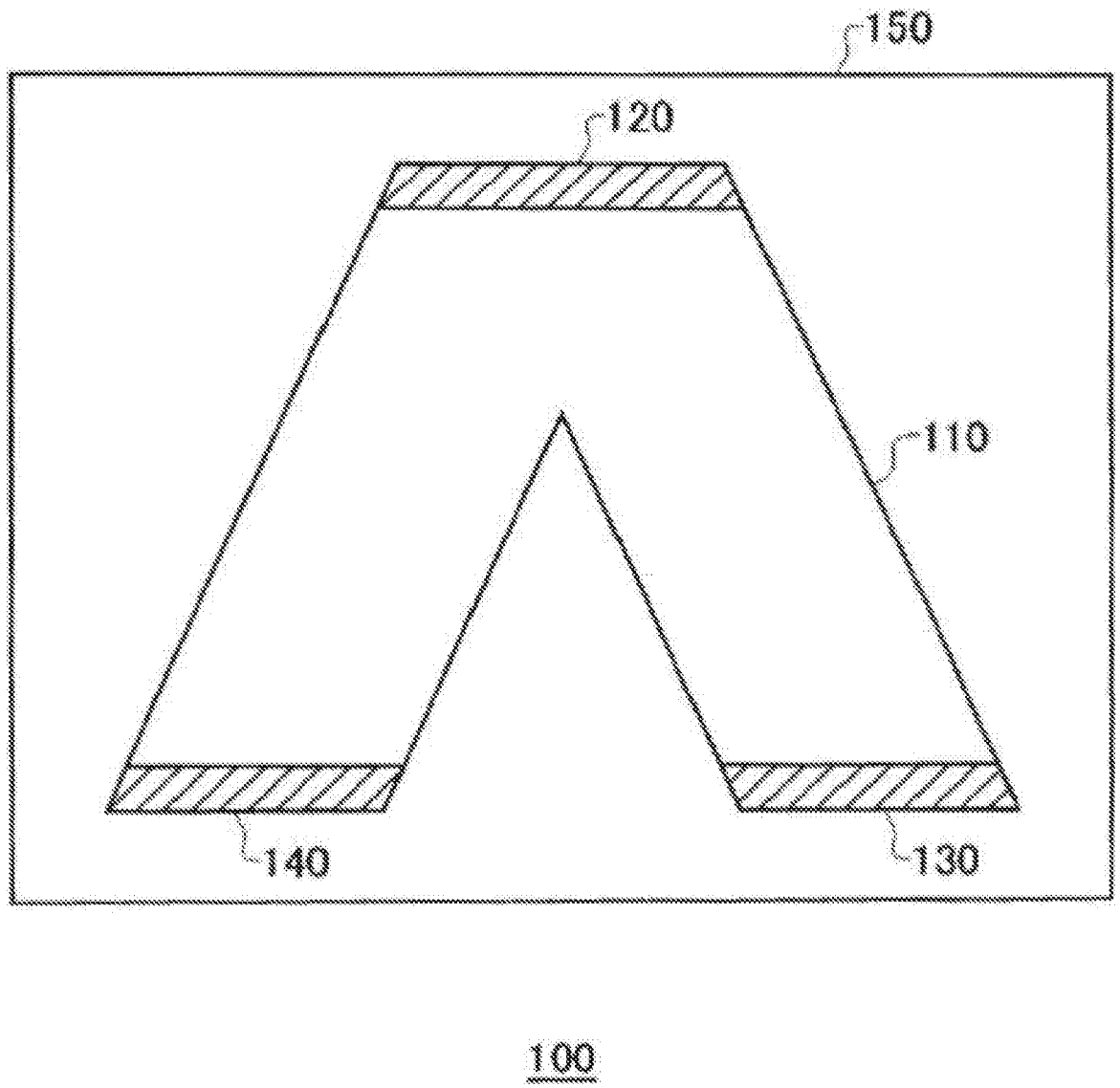
FIG. 9 shows a schematic top view of the magnetic sensor 100 of a sixth example in the present embodiment.

In the magnetic sensor 100 of the sixth example shown in FIG. 9, the magnetic sensing unit 110 has a V-shape, the first output terminal 130 and the second output terminal 140 are formed at two tips of the V-shape, respectively, and the drive terminal 120 is formed at the vertex portion.

Figure 10:
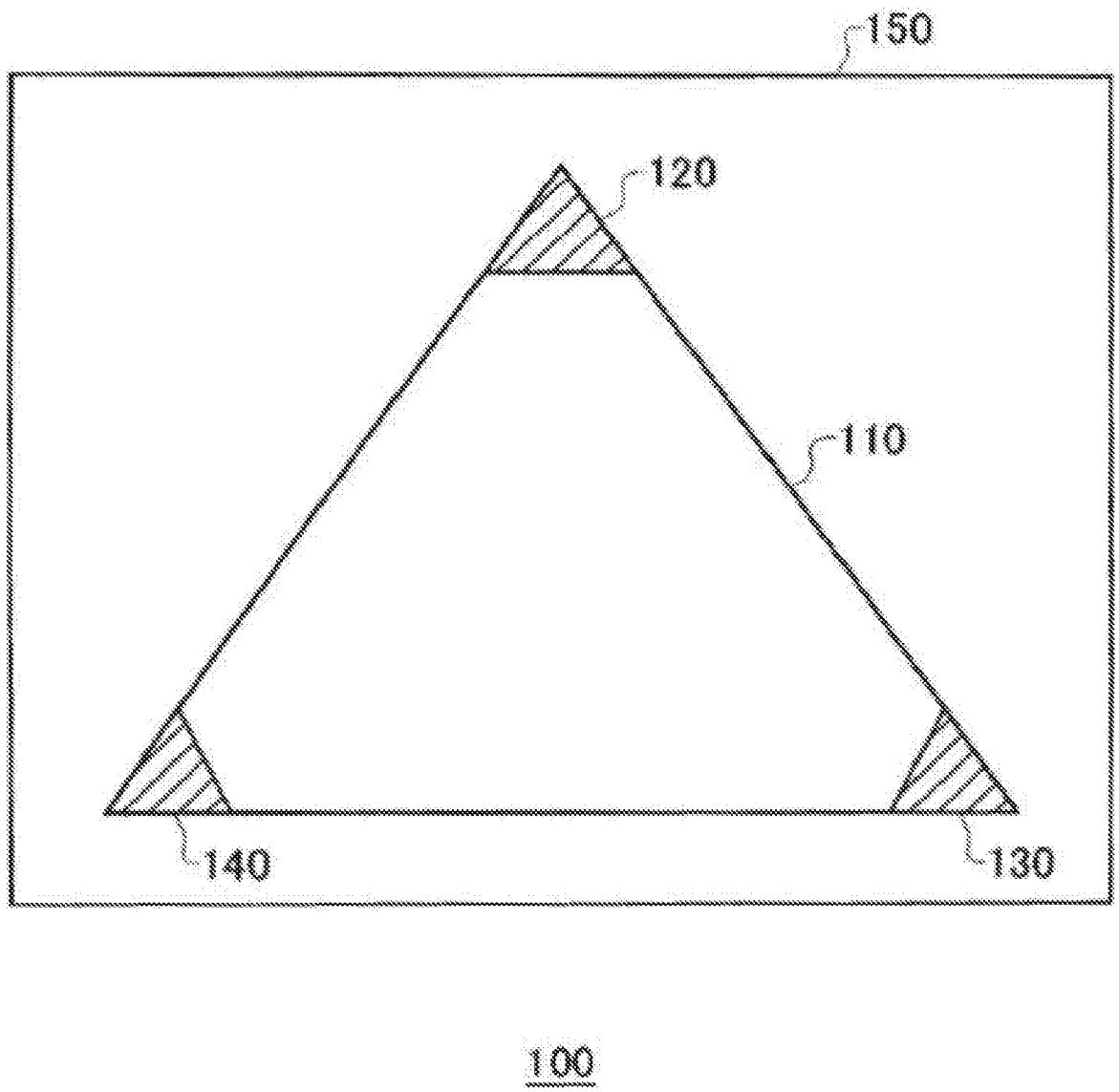
FIG. 10 shows a schematic top view of the magnetic sensor 100 of a seventh example in the present embodiment.

In the magnetic sensor 100 of the seventh example shown in FIG. 10, the magnetic sensing unit 110 has a triangle shape, and the drive terminal 120, the first output terminal 130 and the second output terminal 140 are formed at the respective vertexes, respectively.

Although various shapes of the magnetic sensor 100 are exemplified above, the magnetic sensor 100 may take any shape in which the first conduction path and the second conduction path are formed integrally, without being limited to the above-mentioned examples.

A method of manufacturing the magnetic sensor 100 of the first example shown in FIGS. 1 and 2 is explained as an example of methods to manufacture the above-mentioned magnetic sensor 100 according to the present embodiment. The method of manufacturing the magnetic sensor 100 includes a step of forming the magnetic sensing unit 110 in a trifurcate shape and on the semiconductor substrate 150, and a step of forming the drive terminal 120, the first output terminal 130 and the second output terminal 140 on the formed magnetic sensing unit 110.

At the step of forming the magnetic sensing unit 110 in a trifurcate shape, an active layer may be formed in a trifurcate shape and on the substrate 150 to make it function as the magnetic sensing unit 110. A method of forming an active layer on the substrate 150 is preferably a method of forming a semiconductor single crystal by a MBE (Molecular Beam Epitaxy) apparatus, in terms of crystallinity of the active layer. The method of forming the active layer is not limited thereto, but for example the active layer can be formed by film formation using MOCVD (Metal Organic Chemical Vapor Deposition) or sputtering, lamination of a semiconductor active layer film, implantation, or the like. At this time, the active layer may be formed in a trifurcate shape, or the active layer may be etched to have a trifurcate shape after the active layer is formed on the entire surface of the substrate 150.

At the step of forming the terminals, a metallic film may be formed by sputtering or using a vapor deposition machine on the active layer having the trifurcate shape, and the formed metallic film may be etched to have the shapes of terminals. Furthermore, a step of thermal annealing may be implemented after the terminal formation. Also, a step of forming a protection film on the active layer may be implemented before the terminal formation step, and in this case, the terminals are connected with the active layer through vias. Also, a step of forming a protection film on the active layer may be implemented after the terminal formation step.

Figure 11:
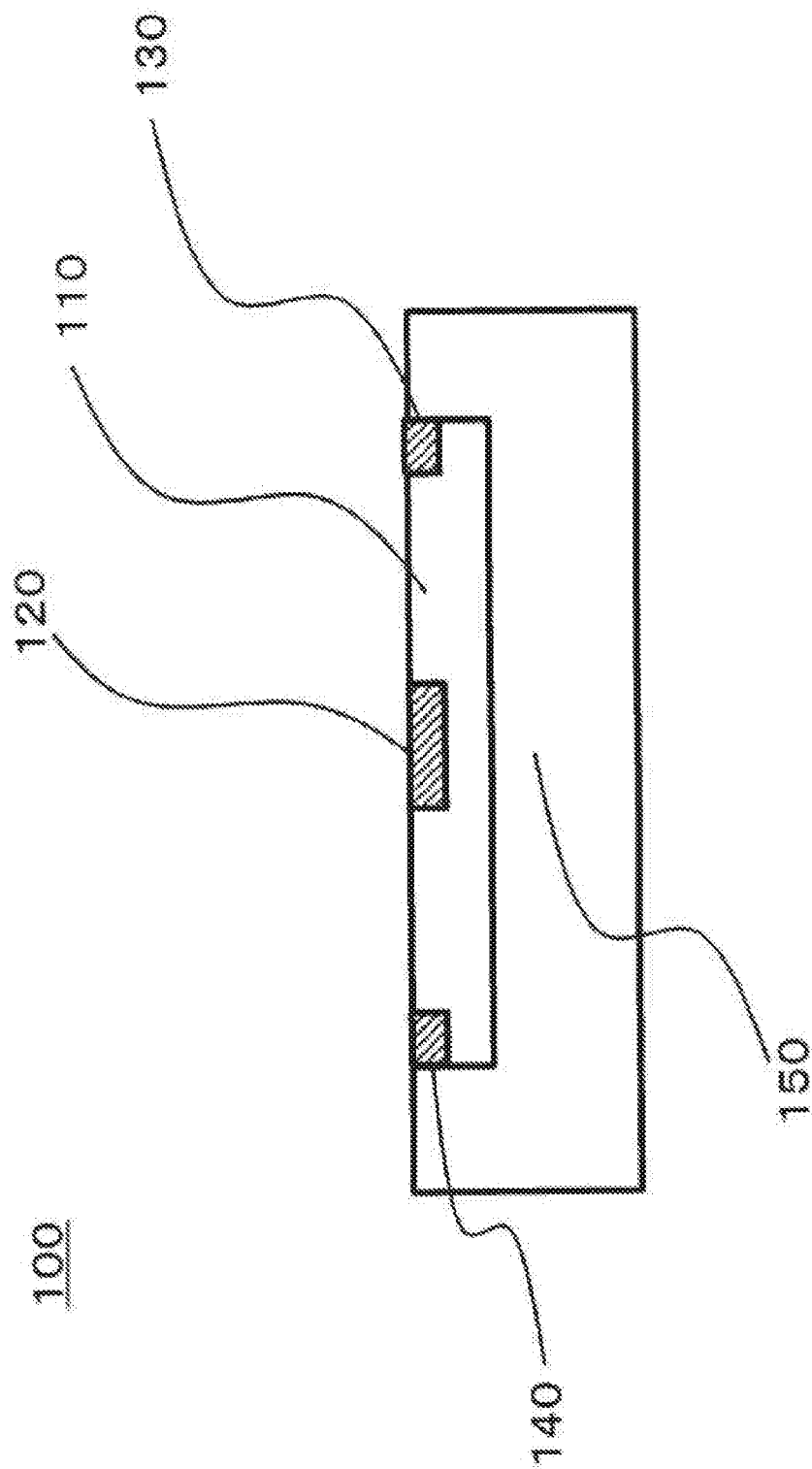
FIG. 11 shows a schematic view of another example of a cross section of the magnetic sensor 100 of the first example in the present embodiment.

FIG. 11 shows a schematic view of another example of a cross section of the magnetic sensor 100 in FIG. 1 taken along A-B. As shown in FIG. 11, the magnetic sensing unit 110 of the magnetic sensor 100 is formed in the substrate 150.

The magnetic sensor 100 in FIG. 11 may be manufactured by a method similar to a known method of manufacturing a magnetic sensor (for example, a silicon Hall element). For example, impurities are implanted to the silicon substrate 150 by implantation or the like, and an impurity diffusion layer is formed in a trifurcate shape in the silicon substrate 150, and is made function as the magnetic sensing unit 110. Thereafter, contact layers are formed at end portions of extending portions of the magnetic sensing unit 110 by implantation or the like, and are made function as the drive terminal 120, the first output terminal 130 and the second output terminal 140. Furthermore, a metal wiring layer to connect with the magnetic detection apparatus 200 may be formed on the silicon substrate 150, and the drive terminal 120, the first output terminal 130 and the second output terminal 140 may be connected to the metal wiring layer through vias.

Figure 12:
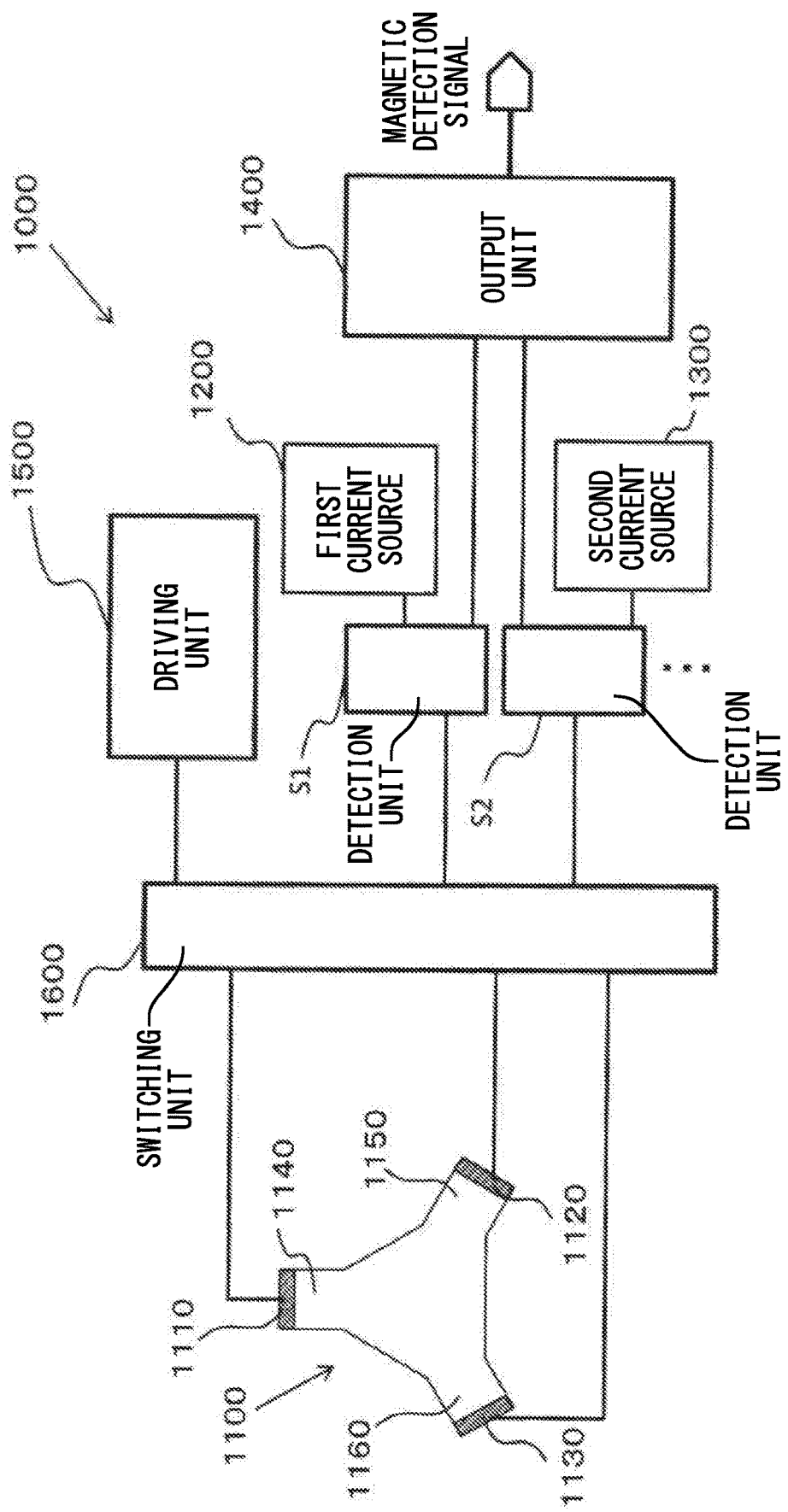
FIG. 12 shows a magnetic detection apparatus 1000 in the present embodiment.

FIG. 12 shows a magnetic detection apparatus 1000 in the present embodiment. The magnetic detection apparatus 1000 performs magnetic detection by performing control such that currents from two sense terminals become equal to each other, and detecting an output difference between the two sense terminals. The magnetic detection apparatus 1000 includes a magnetic sensing unit 1100, a switching unit 1600, a first current source 1200, a second current source 1300, an output unit 1400, a driving unit 1500 and a plurality of detection units S1, S2. The magnetic detection apparatus 1000 may correspond to an apparatus including the magnetic detection apparatus and magnetic sensor in FIG. 3 or 4.

The magnetic sensing unit 1100 has a first terminal 1110, a second terminal 1120 and a third terminal 1130. The magnetic sensing unit 1100 has a first extending unit 1140 extending to the first terminal 1110 and a second extending unit 1150 extending to the second terminal 1120 that are formed integrally. The first extending unit 1140 and the second extending unit 1150 may extend in different directions from each other. For example, the magnetic sensing unit 1100 has a trifurcate shape, the first extending unit 1140 is provided to a first branch portion of the trifurcate shape, the second extending unit 1150 is provided to a second branch portion of the trifurcate shape, and the third terminal 1130 is provided to a third extending portion 1160 extending in a third branch portion of the trifurcate shape.

The magnetic sensing unit 1100 may be formed in a semiconductor substrate, and respective sides constituting the outer circumference of the magnetic sensing unit 1100 may be provided in the cleavage directions on the (111) plane of the semiconductor substrate as shown in FIG. 5. Also, the magnetic sensing unit 1100 may have any of the shapes shown in FIGS. 1, and 5 to 10.

The switching unit 1600 performs switching to select a terminal, among the terminals 1110, 1120, 1130 provided to the magnetic sensing unit 1100, that is to be connected to the output unit 1400. The switching unit 1600 is connected to the first terminal 1110, second terminal 1120 and third terminal 1130 of the magnetic sensing unit 1100, respectively, and is connected to the driving unit 1500 and the plurality of detection units S1, S2, respectively, on the other side.

The switching unit 1600 for example has three 3-to-1 switches. By controlling ON and OFF of switches, the switching unit 1600 can switch the connection relationship between the first terminal 1110, second terminal 1120 and third terminal 1130 and the driving unit 1500 and detection units S1, S2. It is assumed in the following description that terminals that are among the first terminal 1110, second terminal 1120 and third terminal 1130 of the magnetic sensing unit 1100 and are connected to the detection units S1, S2 function as sense terminals, and the remaining terminal connected to the driving unit 1500 functions as the drive terminal. Here, the drive terminal may simply mean a terminal other than two sense terminals in the magnetic sensing unit 1100. The sense terminals correspond to output terminals in FIGS. 1 to 11.

The first current source 1200 and the second current source 1300 may be constant current sources that are connected to two sense terminals, respectively, and cause constant currents to flow therethrough. For example, the first current source 1200 is connected to the first terminal 1110 (first sense terminal) of the magnetic sensing unit 1100 through the switching unit 1600, and the second current source 1300 is connected to the second terminal 1120 (second sense terminal) of the magnetic sensing unit 1100 through the switching unit 1600. The first current source 1200 and the second current source 1300 perform adjustment such that currents to be caused to flow between themselves and the magnetic sensing unit 1100 are made close to each other. The first current source 1200 and the second current source 1300 are constituted by a current mirror circuit(s), for example.

The driving unit 1500 is connected to the switching unit 1600, and supplies, to the drive terminal through the switching unit 1600, energy necessary for driving the magnetic detection apparatus 1000.

The plurality of detection units S1, S2 are connected to the switching unit 1600, and the first current source 1200 and the second current source 1300, respectively. The detection units S1, S2 each detect an output of any of the two sense terminals by being connected to the sense terminals through the switching unit 1600. The detection units S1, S2 are, for example, galvanometers, voltmeters or contacts, and detect voltages at sense terminals. The number of the detection units S1, S2 is not limited to two, but may be three or more. Also, a single detection unit may be used in a time-division manner.

The output unit 1400 outputs a magnetic detection signal based on an output from two sense terminals that are among the first terminal 1110, second terminal 1120 and third terminal 1130 of the magnetic sensing unit 1100 and are used as sense terminals. The output unit 1400 is connected to the plurality of detection units S1, S2, receives an output detected by each among the plurality of detection units S1, S2, and outputs a magnetic detection signal corresponding to a difference between the outputs received.

For example, if the first terminal 1110 and the second terminal 1120 are connected to the detection units S1, S2, the output unit 1400 outputs a magnetic detection signal corresponding to a difference between a voltage on the first terminal 1110 (first sense terminal) side of the magnetic sensing unit 1100 and a voltage on the second terminal 1120 (second sense terminal) side of the magnetic sensing unit 1100. The output unit 1400 may output voltages at two sense terminals as is, as a magnetic detection signal or may output a value indicating a difference between the detected voltages as a magnetic detection signal. Also, the output unit 1400 may calculate the magnitude and/or orientation of a magnetic field based on the detected voltages, and output, as a magnetic detection signal, a signal indicating the magnitude and/or orientation of the magnetic field. The detection units S1, S2 and output unit 1400 in the present embodiment may correspond to the magnetic detection unit 220 in FIGS. 3 and 4.

A method of detecting a magnetic field by chopping-drive using the magnetic detection apparatus 1000 of the present embodiment is explained. In the method explained below, two sense terminals are connected to constant current sources, respectively, and mutually equal currents are caused to flow therethrough.

Figure 13:
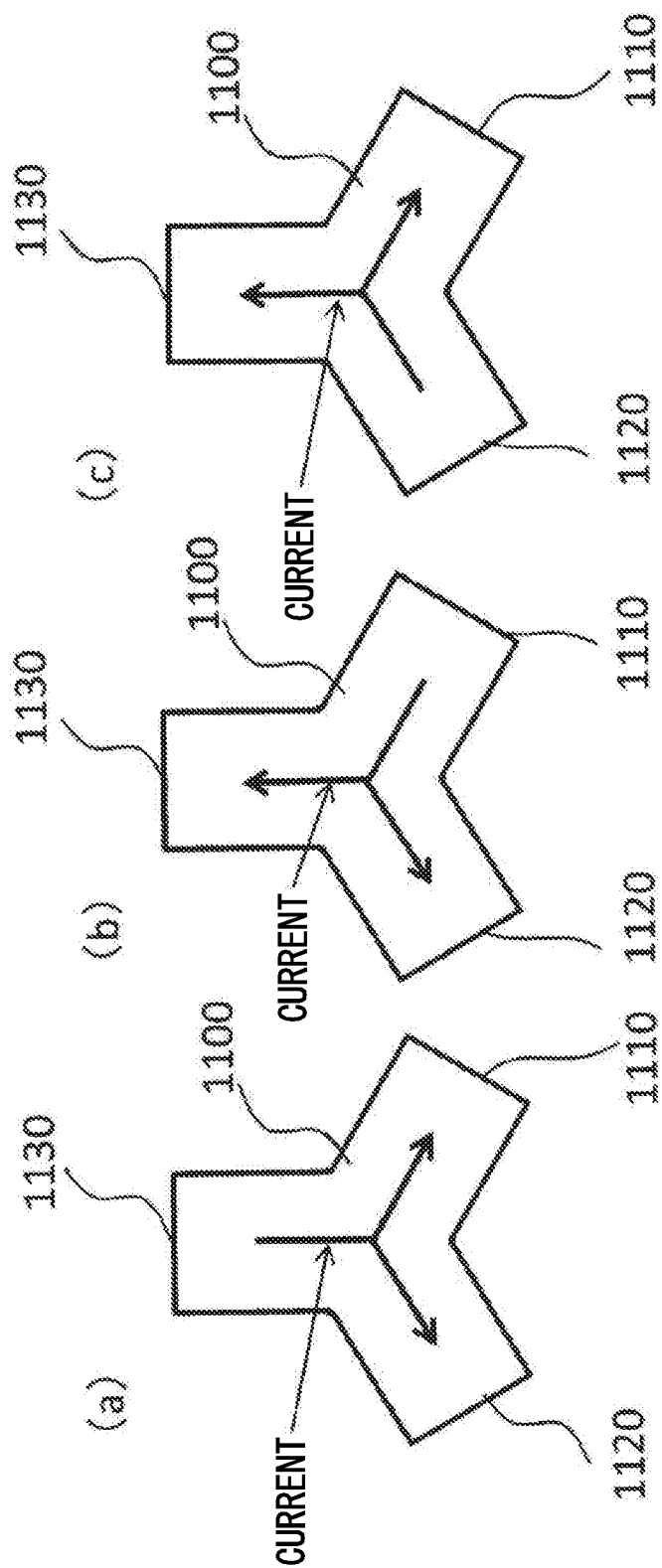
FIG. 13 shows a schematic view showing switching between the drive terminal and the sense terminals.

FIG. 13 is a schematic view showing switching of the drive terminal. The switching unit 1600 changes the connection relationship between the first terminal 1110, second terminal 1120 and third terminal 1130, and the driving unit 1500, first current source 1200 and second current source 1300 to switch the sense terminals and the drive terminal and switch flows of current among (a) to (c). The output unit 1400 outputs a magnetic detection signal based on: a first output difference between the first terminal 1110 and the second terminal 1120 that is obtained if the first terminal 1110 and the second terminal 1120 are used as the two sense terminals in the case of (a); a second output difference between the second terminal 1120 and the third terminal that is obtained if the second terminal 1120 and the third terminal are used as the two sense terminals in the case of (b); and a third output difference between the third terminal 1130 and the first terminal 1110 that is obtained if the third terminal 1130 and the first terminal 1110 are used as the two sense terminals in the case of (c). Switching of terminals by the switching unit 1600 may be performed at a chopper frequency.

In the following description, a first magnetic detection method using the magnetic detection apparatus 1000 if it includes three detection units S1, S2, S3 is explained. The three detection units S1, S2, S3 are provided corresponding to the first terminal 1110, the second terminal 1120 and the third terminal 1130, respectively, and each detect an output from a corresponding terminal. Two among the three detection units S1, S2, S3 may be connected to one of the first current source 1200 and the second current source 1300, and one of them may be connected to the other current source. Also, the magnetic detection apparatus 1000 further may include a third current source which is not illustrated in figures, and the three detection units S1, S2, S3 may be connected to three current sources, respectively.

As the first magnetic detection method, a method of performing magnetic detection by outputting first to third phase signals from the output unit 1400 under the following three conditions is explained.

First phase signal: $V13_{S3}-V12_{S1}$
Second phase signal: $V21_{S1}-V23_{S2}$
Third phase signal: $V32_{S2}-V31_{S3}$ Here, $Vij_{Sk}$ represents a voltage detected by a detection unit Sk connected to a j-th terminal if the drive terminal is an i-th terminal and a sense terminal is the j-th terminal. For example, the first phase signal is a magnetic detection signal indicating a difference between a voltage ($V12_{S2}$) detected by the detection unit S2 connected to the second terminal 1120 and a voltage ($V13_{S3}$) detected by the detection unit S3 connected to the third terminal 1130 if the second terminal 1120 and the third terminal 1130 are used as the sense terminals. This method of notation applies also in the following description.

In the first magnetic detection method, a current is caused to flow through the magnetic sensing unit 1100 while switching the drive terminal and the sense terminals, and the output unit 1400 outputs the first to third phase signals. The magnetic detection apparatus 1000 may perform magnetic detection using the first to third phase signals. In the first magnetic detection method, the correspondence between the first terminal 1110, second terminal 1120 and third terminal 1130 and the detection units S1, S2, S3 was fixed, and magnetic detection was performed. That is, the switching unit 1600 performed switching such that the first terminal 1110 connects to the detection unit S1 if the first terminal 1110 is used as a sense terminal, the second terminal 1120 connects to the detection unit S2 if the second terminal 1120 is used as a sense terminal, and the third terminal 1130 connects to the detection unit S3 if the third terminal 1130 is used as a sense terminal. In the first magnetic detection method, for example, a magnetic detection result from which an offset attributable to the magnetic sensing unit 1100 is eliminated can be obtained by adding up voltage differences indicated by the first to third phase signals, respectively.

Next, as a second magnetic detection method, a method of performing magnetic detection by performing chopping-driving and outputting first to sixth phase signals from the output unit 1400 under the following six conditions is explained.

First phase signal: $V13_{S3}-V12_{S2}$
Second phase signal: $V21_{S1}-V23_{S3}$
Third phase signal: $V32_{S2}-V31_{S1}$
Fourth phase signal: $V13_{S2}-V12_{S3}$
Fifth phase signal: $V21_{S3}-V23_{S1}$
Sixth phase signal: $V32_{S1}-V31_{S2}$ In the second magnetic detection method, the correspondence between the first terminal 1110, second terminal 1120 and third terminal 1130 and the detection units S1, S2, S3 was changed, and magnetic detection was performed. In the second magnetic detection method, the switching unit 1600 selects to which terminal among two sense terminals each among the detection units S1 to S3 is connected, to change the correspondence between the detection units S1, S2, S3 and the terminals 1110, 1120, 1130. The output unit 1400 outputs a magnetic detection signal at each of the first to sixth phases. For example, by summing up voltage differences indicated by the magnetic detection signals, a magnetic detection result from which offset differences at the magnetic sensing unit 1100 and the detection units S1, S2, S3 are eliminated can be obtained.

Next, a magnetic detection method using the magnetic detection apparatus 1000 if it includes the two detection units S1, S2 is explained. The switching unit 1600 selects to which terminal among two sense terminals each among the detection units S1, S2 is connected, to change the correspondence between the detection units S1, S2 and the terminals 1110, 1120, 1130. The two sense terminals are connected to the first current source 1200 and the second current source 1300, and a constant current Ic is caused to flow through each of them.

The switching unit 1600 changes combinations of the detection units S1, S2 that are connected to the two sense terminals, among the detection units S1, S2, . . . , at at least one among multiple times of detection of the first output difference (for example, an output difference in the case of (a) in FIG. 13), multiple times of detection of the second output difference (for example, an output difference in the case of (b) in FIG. 13), and multiple times of detection of the third output difference (for example, an output difference in the case of (c) in FIG. 13). The combinations of the detection units S1, S2 and the sense terminals may be determined according to a sense terminal on the positive-side and a sense terminal on the negative-side of an output difference caused by a magnetic field as in the following manner.

In detection of the first output difference, the second output difference and the third output difference, the switching unit 1600 uses each of the detection units S1, S2 for both detection on the positive-side and detection on the negative-side in calculation of a difference between outputs. If output is to be performed multiple times using the same terminal as the drive terminal, the switching unit 1600 may switch, at each output, between the detection units S1, S2 as detection units to be connected to two sense terminals, respectively. For example, at the time when detection of the first output difference between the first terminal 1110 and the second terminal 1120 is to be performed twice if the two terminals are used as sense terminals, at the first output, the detection unit S1 is connected to the first terminal 1110 to detect a voltage, and the detection unit S2 is connected to the second terminal 1120 to detect a voltage, and at the second output, the detection unit S2 is connected to the first terminal 1110 to detect a voltage, and the detection unit S1 is connected to the second terminal 1120 to detect a voltage.

The switching unit 1600 selects the detection units S1, S2 to be connected to two sense terminals, respectively, such that the number of times each among the detection units S1, S2 is used for detection on the positive-side in calculation of a difference between outputs, and the number of times each among the detection units S1, S2 is used for detection on the negative-side in calculation of a difference between outputs are made close to each other. Accordingly, in order to make the number of times each of the detection units S1, S2 is used for the positive-side and the number of times each of them is used for the negative-side equal to each other, the number of combinations between the three terminals 1110, 1120, 1130 and the detection units S1, S2 become at least six (switching of the drive terminal among the first to third terminals: three patterns x switching of the sense terminals between the two detection units S1, S2: two patterns). Because of this, magnetic detection may be performed with conditions being changed the number of times (6N phases) which is equal to a multiple of six, the lowest common multiple of the number of terminals of the magnetic sensing unit 1100 and the number of the detection units S1, S2.

A method of performing magnetic detection by performing chopping-driving and outputting first to sixth phase signals from the output unit 1400 under the following six conditions is explained.

First phase signal: $V12_{S1}-V13_{S2}$
Second phase signal: $V23_{S1}-V21_{S2}$
Third phase signal: $V31_{S1}-V32_{S2}$
Fourth phase signal: $V12_{S2}-V13_{S1}$
Fifth phase signal: $V23_{S2}-V21_{S1}$
Sixth phase signal: $V31_{S2}-V32_{S1}$ Here, a magnetic detection method is explained with reference to FIGS. 14 to 19 supposing the following relationship.

$$Vx'=Vx+V_{offx} \qquad \text{Equation (i)}$$

Vx' (x=1, 2) is a voltage of a sense terminal, Vx is a voltage detected at a detection unit Sx, and $V_{offx}$ (x=1, 2) is an offset of a voltage that the detection unit Sx has. $V_{offx}$ is represented as $V_{offx}$ with an offset of the output unit 1400 included therein.

$$Ic=I_{Ry}+I_{hy(n)} \qquad \text{Equation (ii)}$$

Ic is a constant current that flows due to a current source, and $I_{Ry}$ is a current that flows through a resistance Ry (y=1, 2, 3). $I_{hy(n)}$ indicates a current generated to a y-th terminal at an n-th phase due to application of a magnetic field, and is provided as a current source whose current value increases or decreases depending on the magnetic field.

The resistance Ry is a resistance at the magnetic sensing unit 1100 that acts on a current output from the y-th terminal. For example, if the first terminal 1110 is the drive terminal, the resistance that acts on a current flowing between the first terminal 1110 and the second terminal 1120 is R1+R2, and a resistance that acts on a current flowing between the first terminal 1110 and the third terminal 1130 is R1+R3. Accordingly, the resistance R1 is a resistance common to currents that flow from the first terminal 1110 toward the second terminal 1120 and the third terminal 1130, respectively. Vc in the equation shown below is a voltage at the central position of three terminals.

Figure 14:
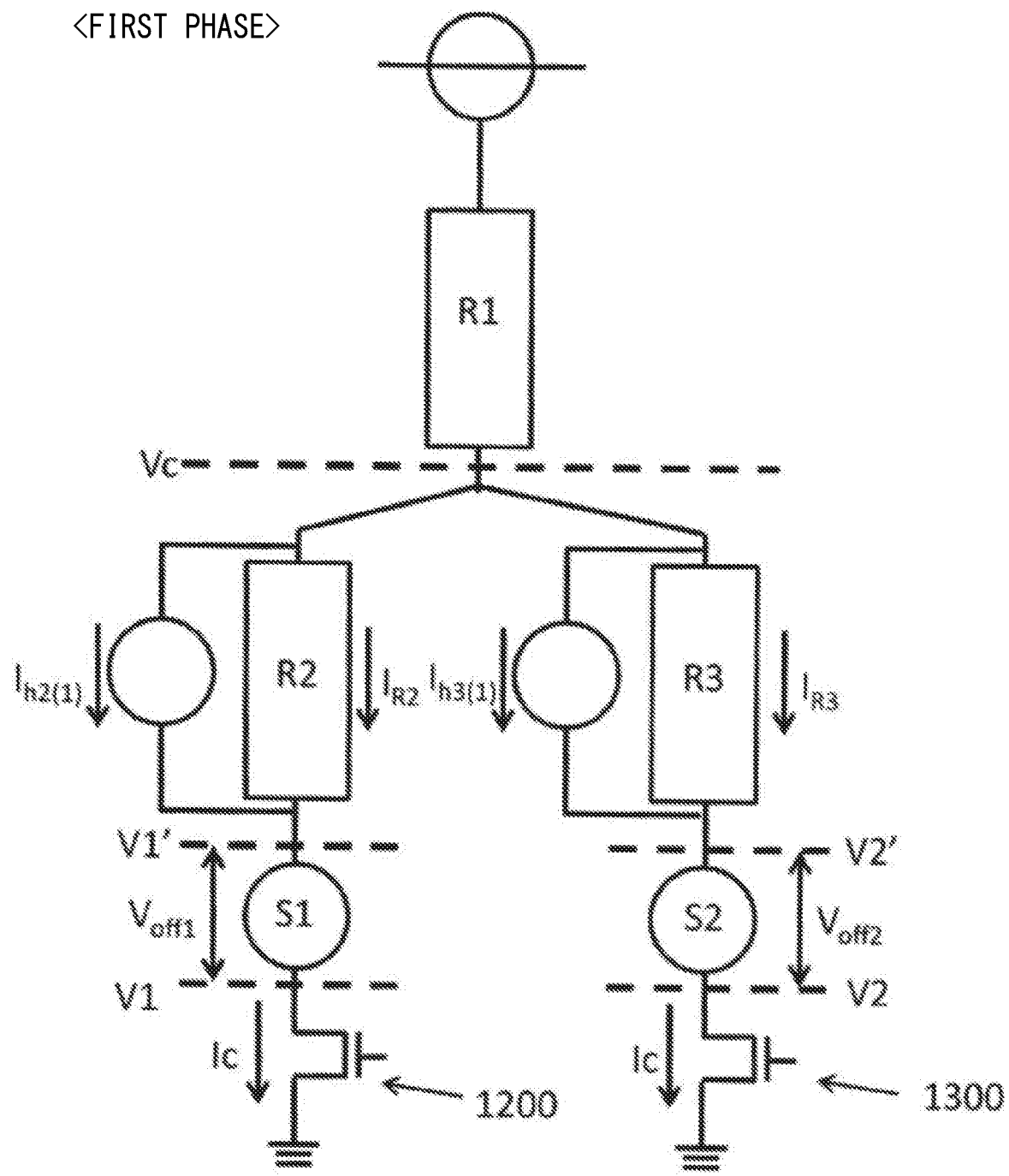
FIG. 14 shows a circuit diagram showing a situation where a first phase signal is output.

FIG. 14 shows a circuit diagram showing a situation where a first phase signal is output from the output unit 1400. At the first phase, the first terminal 1110 is the drive terminal, the second terminal 1120 and the third terminal 1130 are sense terminals, and the detection units S1, S2 are connected to the second terminal 1120 and the third terminal 1130, respectively. From the circuit diagram showing a situation where the first phase signal is output, (Equation *1)

is derived based on Equations (i), (ii) shown above and Equations (1), (2) shown below.

$$(Vc-V1')/R2 = I_{R2} \qquad \text{Equation (1)}$$

$$(Vc-V2')/R3 = I_{R3} \qquad \text{Equation (2)}$$

$$V1-V2 = I_c(R3-R2) - (I_{h3(1)}R3 - I_{h2(1)}R2) - (V_{off1} - V_{off2}) \qquad \text{(Equation *1)}$$

Figure 15:
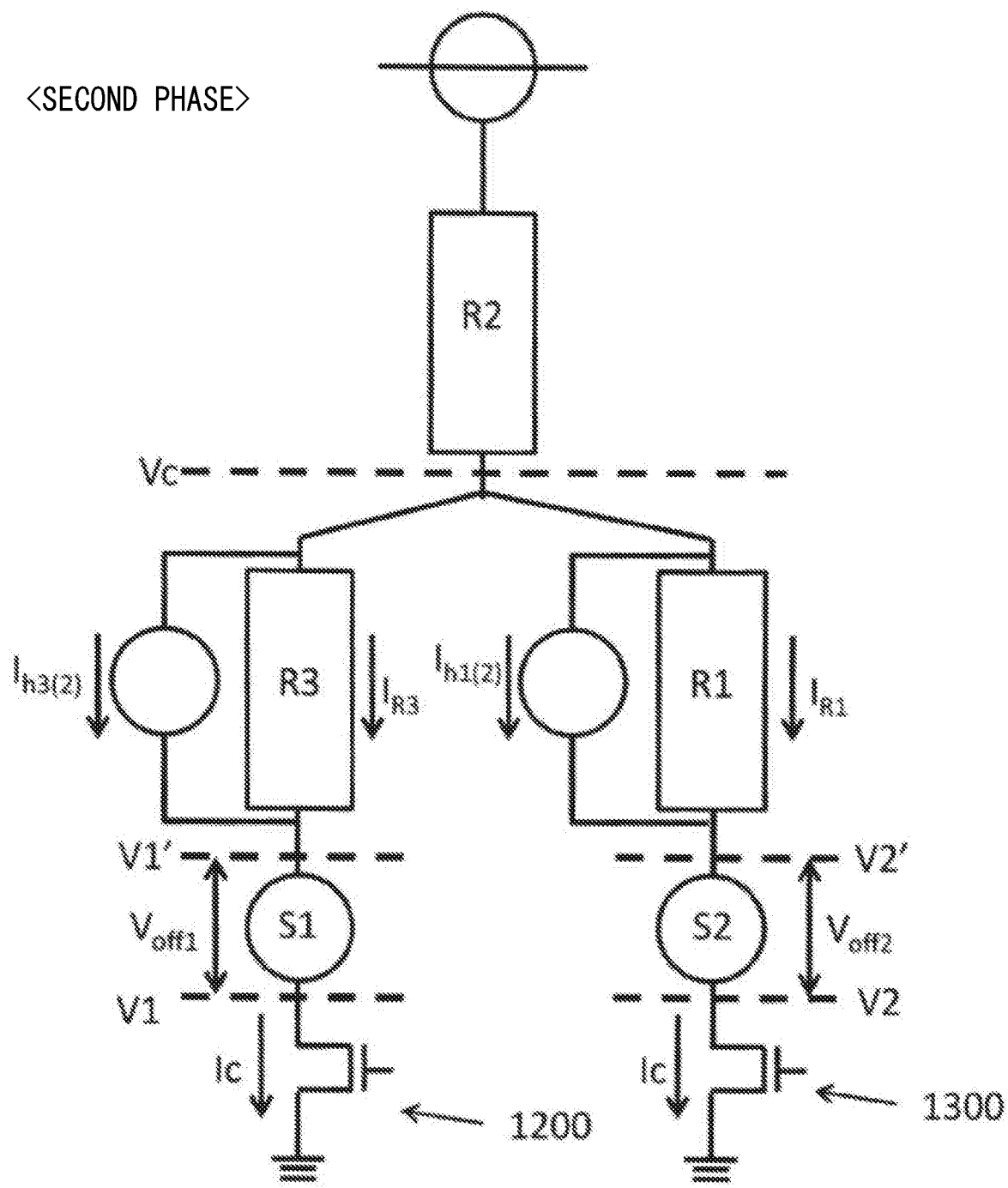
FIG. 15 shows a circuit diagram showing a situation where a second phase signal is output.

FIG. 15 shows a circuit diagram showing a situation where a second phase signal is output from the output unit 1400. At the second phase, the second terminal 1120 is the drive terminal, the first terminal 1110 and the third terminal 1130 are sense terminals, and the detection units S2, S1 are connected to the first terminal 1110 and the third terminal 1130, respectively. From the circuit diagram showing a situation where the second phase signal is output, (Equation *2) is derived based on Equations (i), (ii) shown above and Equations (1), (2) shown below.

$$(Vc-V1')/R3 = I_{R3} \qquad \text{Equation (1)}$$

$$(Vc-V2')/R1 = I_{R1} \qquad \text{Equation (2)}$$

$$V1-V2 = I_c(R1-R3) - (I_{h1(2)}R1 - I_{h3(2)}R3) - (V_{off1} - V_{off2}) \qquad \text{(Equation *2)}$$

Figure 16:
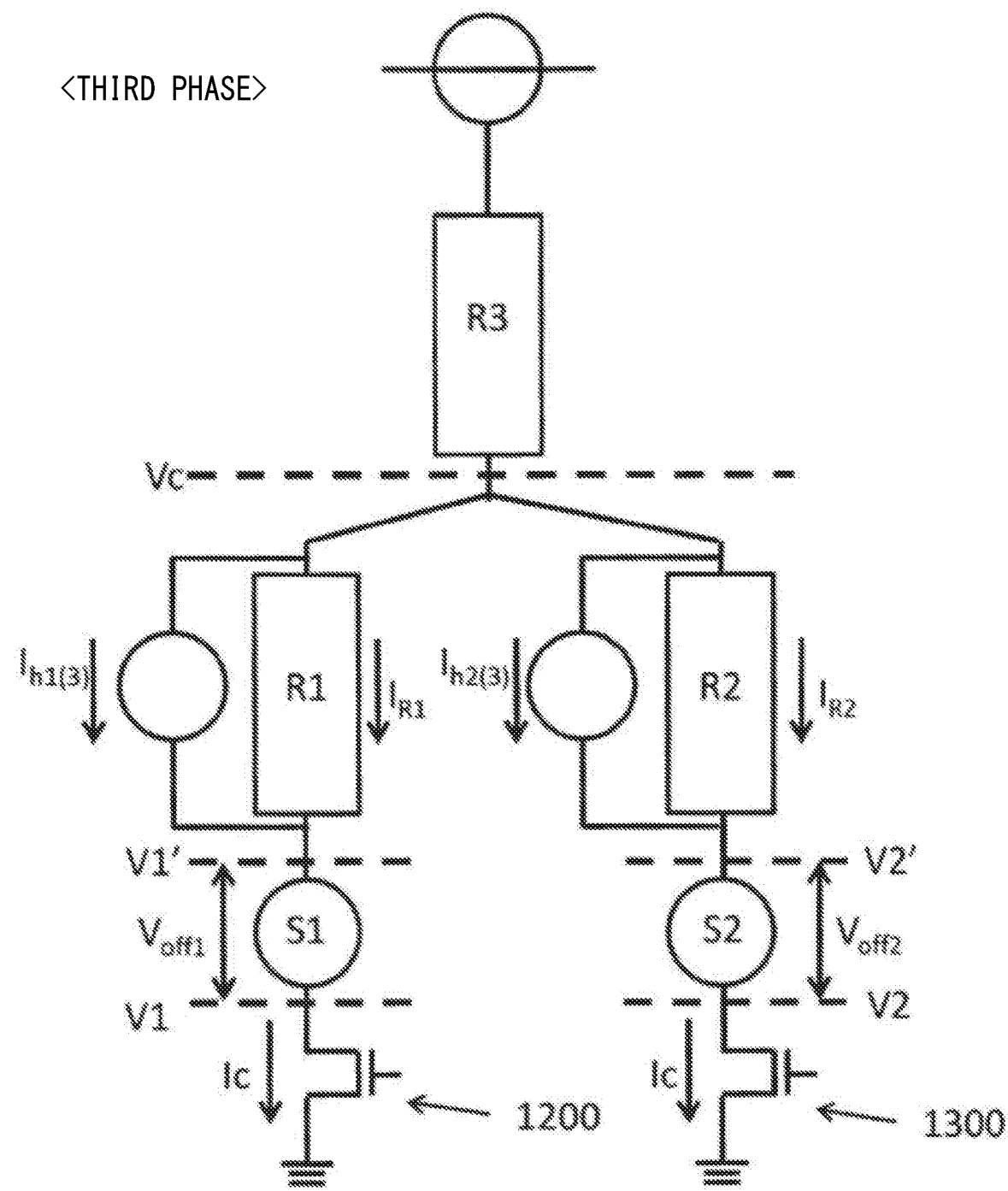
FIG. 16 shows a circuit diagram showing a situation where a third phase signal is output.

FIG. 16 shows a circuit diagram showing a situation where a third phase signal is output from the output unit 1400. At the third phase, the third terminal 1130 is the drive terminal, the first terminal 1110 and the second terminal 1120 are sense terminals, and the detection units S1, S2 are connected to the first terminal 1110 and the second terminal 1120, respectively. From the circuit diagram showing a situation where the third phase signal is output, (Equation *3) is derived based on Equations (i), (ii) shown above and Equations (1), (2) shown below.

$$(Vc-V1')/R1 = I_{R1} \qquad \text{Equation (1)}$$

$$(Vc-V2')/R2 = I_{R2} \qquad \text{Equation (2)}$$

$$V1-V2 = I_c(R2-R1) - (I_{h2(3)}R2 - I_{h1(3)}R1) - (V_{off1} - V_{off2}) \qquad \text{(Equation *3)}$$

Figure 17:
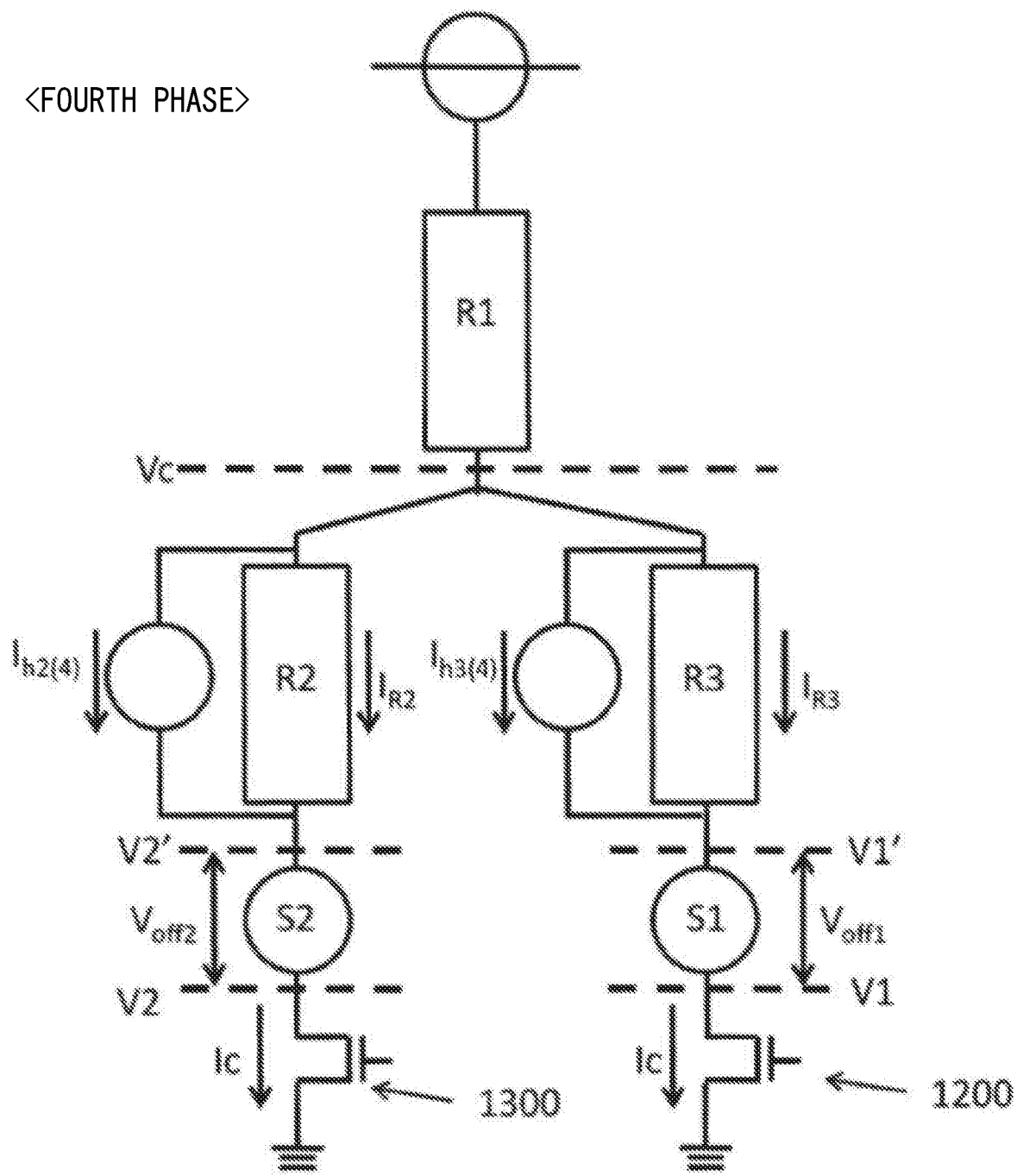
FIG. 17 shows a circuit diagram showing a situation where a fourth phase signal is output.

FIG. 17 shows a circuit diagram showing a situation where a fourth phase signal is output from the output unit 1400. At the fourth phase, the first terminal 1110 is the drive terminal, the second terminal 1120 and the third terminal 1130 are sense terminals, and the detection units S2, S1 are connected to the second terminal 1120 and the third terminal 1130, respectively. From the circuit diagram showing a situation where the fourth phase signal is output, (Equation *4) is derived based on Equations (i), (ii) shown above and Equations (1), (2) shown below.

$$(Vc-V1')/R3 = I_{R3} \qquad \text{Equation (1)}$$

$$(Vc-V2')/R2 = I_{R2} \qquad \text{Equation (2)}$$

$$V2-V1 = I_c(R3-R2) - (I_{h3(4)}R3 - I_{h2(4)}R2) - (V_{off2} - V_{off1}) \qquad \text{(Equation *4)}$$

Figure 18:
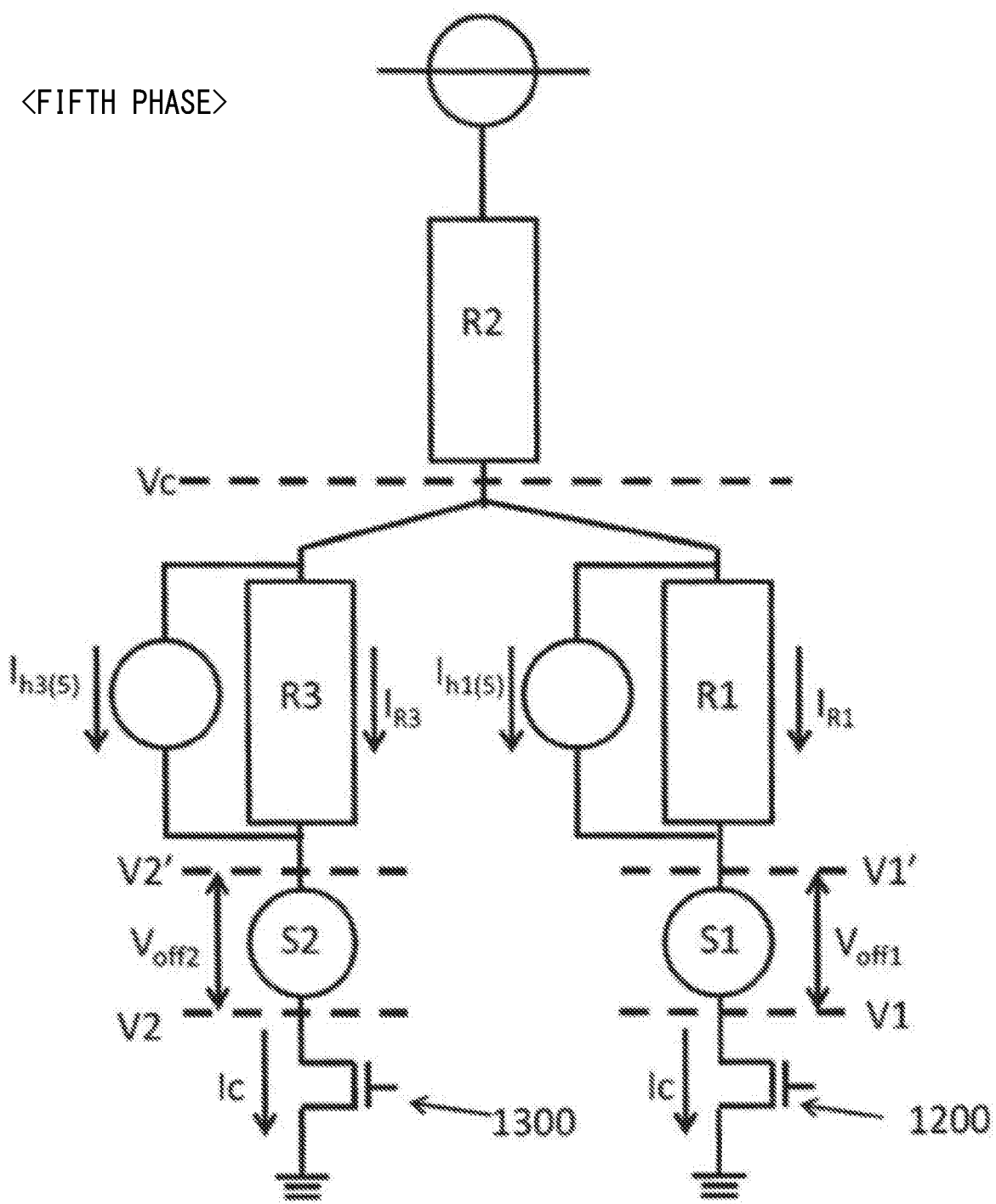
FIG. 18 shows a circuit diagram showing a situation where a fifth phase signal is output.

FIG. 18 shows a circuit diagram showing a situation where a fifth phase signal is output from the output unit 1400. At the fifth phase, the second terminal 1120 is the drive terminal, the first terminal 1110 and the third terminal 1130 are sense terminals, and the detection units S1, S2 are connected to the first terminal 1110 and the third terminal 1130, respectively. From the circuit diagram showing a situation where the fifth phase signal is output, (Equation *5) is derived based on Equations (i), (ii) shown above and Equations (1), (2) shown below.

$$(Vc-V1')/R1 = I_{R1} \qquad \text{Equation (1)}$$

$$(Vc-V2')/R3 = I_{R3} \qquad \text{Equation (2)}$$

$$V2-V1 = I_c(R1-R3) - (I_{h1(5)}R1 - I_{h3(5)}R3) - (V_{off2} - V_{off1}) \qquad \text{(Equation *5)}$$

Figure 19:
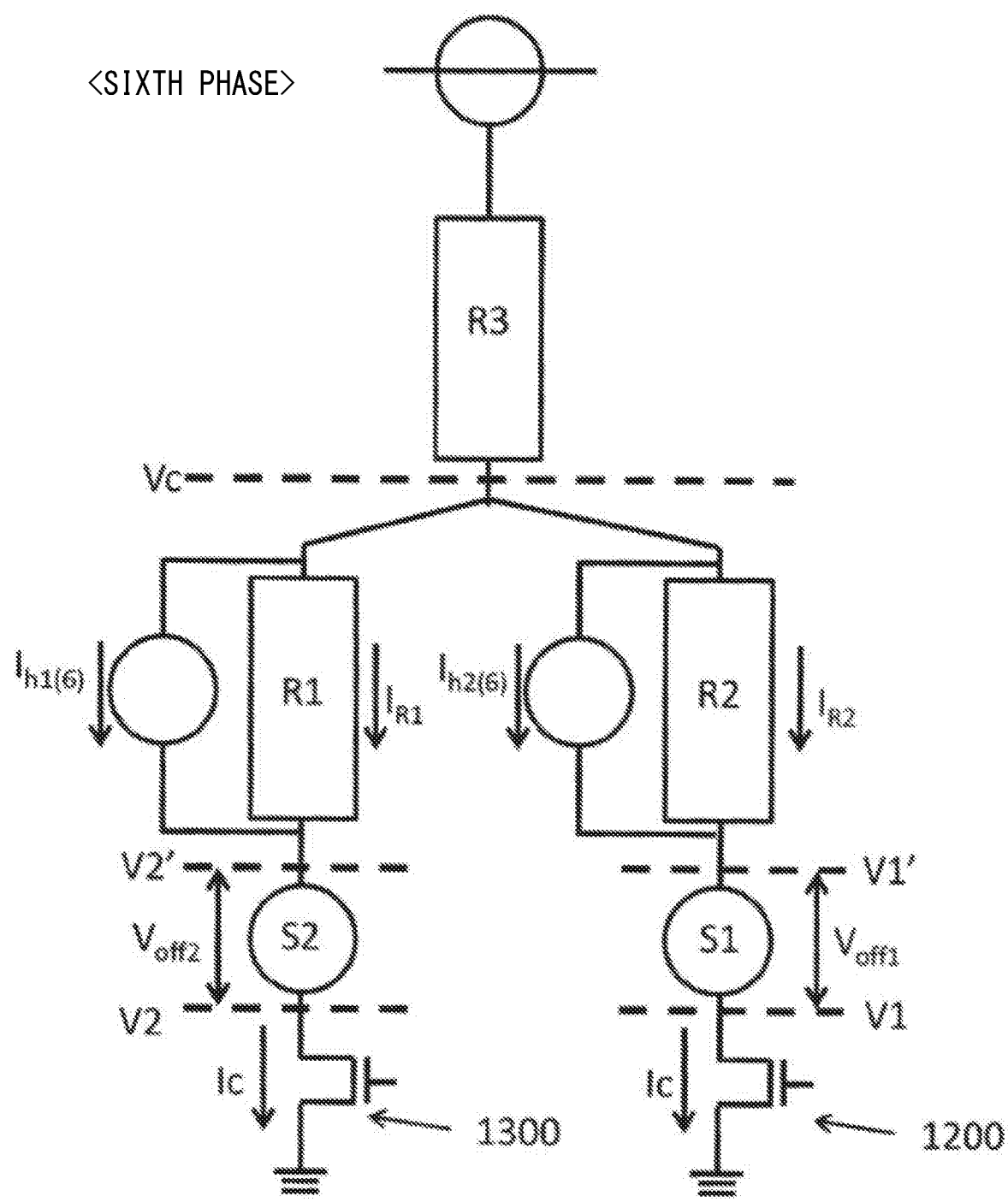
FIG. 19 shows a circuit diagram showing a situation where a sixth phase signal is output.

FIG. 19 shows a circuit diagram showing a situation where a sixth phase signal is output from the output unit 1400. At the sixth phase, the third terminal 1130 is the drive terminal, the first terminal 1110 and the second terminal 1120 are sense terminals, and the detection units S2, S1 are connected to the first terminal 1110 and the second terminal 1120, respectively. From the circuit diagram showing a situation where the sixth phase signal is output, (Equation *6) is derived based on Equations (i), (ii) shown above and Equations (1), (2) shown below.

$$(Vc-V1')/R2 = I_{R2} \qquad \text{Equation (1)}$$

$$(Vc-V2')/R1 = I_{R1} \qquad \text{Equation (2)}$$

$$V2-V1 = I_c(R2-R1) - (I_{h2(6)}R2 - I_{h1(6)}R1) - (V_{off2} - V_{off1}) \qquad \text{(Equation *6)}$$

Based on the derived (Equation *1) to (Equation *6) and differences between (V1−V2) of voltages detected by the detection units S1, S2 at the respective phases, a magnetic detection result from which offsets generated at the detection units S1, S2 and the magnetic sensing unit 1100, and the like are eliminated can be obtained as in the following manner.

If ideally R1=R2=R3, and $V_{off1} = V_{off2}$, an output difference between sense terminals is calculated by any one of (Equation *1) to (Equation *6). Based on the calculated output difference, the orientation and/or intensity of a magnetic field can be detected. The situation where R1=R2=R3 is, for example, a situation where the magnetic sensing unit 1100 has the shape as shown in FIGS. 1, 5 and 10 and is rotation-symmetric, the distances among the three terminal of the magnetic sensing unit 1100 are all the same, and there is no variation in the thickness of the magnetic sensing unit 1100. The situation where $V_{off1} = V_{off2}$ is, for example, a situation where offsets of the detection units S1, S2 are the same.

Also, if R1≠R2≠R3 and $V_{off1} = V_{off2}$, only the sensitivity term of the second term can be obtained through (Equation *1)+(Equation *2)+(Equation *3) or (Equation *4)+(Equation *5)+(Equation *6). Thereby, an offset difference generated due to variation in resistances between terminals of the magnetic sensing unit 1100 can be eliminated, and the orientation and/or intensity of a magnetic field can be detected.

Also, if R1≠R2≠R3 and $V_{off1} \neq V_{off2}$, only the sensitivity term of the second term can be obtained through (Equation *1)+(Equation *2)+(Equation *3)+(Equation *4)+(Equation *5)+(Equation *6). Thereby, an offset difference generated due to variation in resistances between terminals of the magnetic sensing unit 1100 and due to the detection units S1, S2 can be eliminated, and the orientation and/or intensity of a magnetic field can be detected.

Because in the magnetic detection of the present embodiment, a voltage difference is detected as an output of the magnetic sensing unit 1100, the magnetic detection is less dependent on temperature, and detection errors are smaller. The magnetic detection can be made still less dependent on temperature by using a material with a wider bandgap in fabrication of the magnetic sensing unit 1100.

Figure 20:
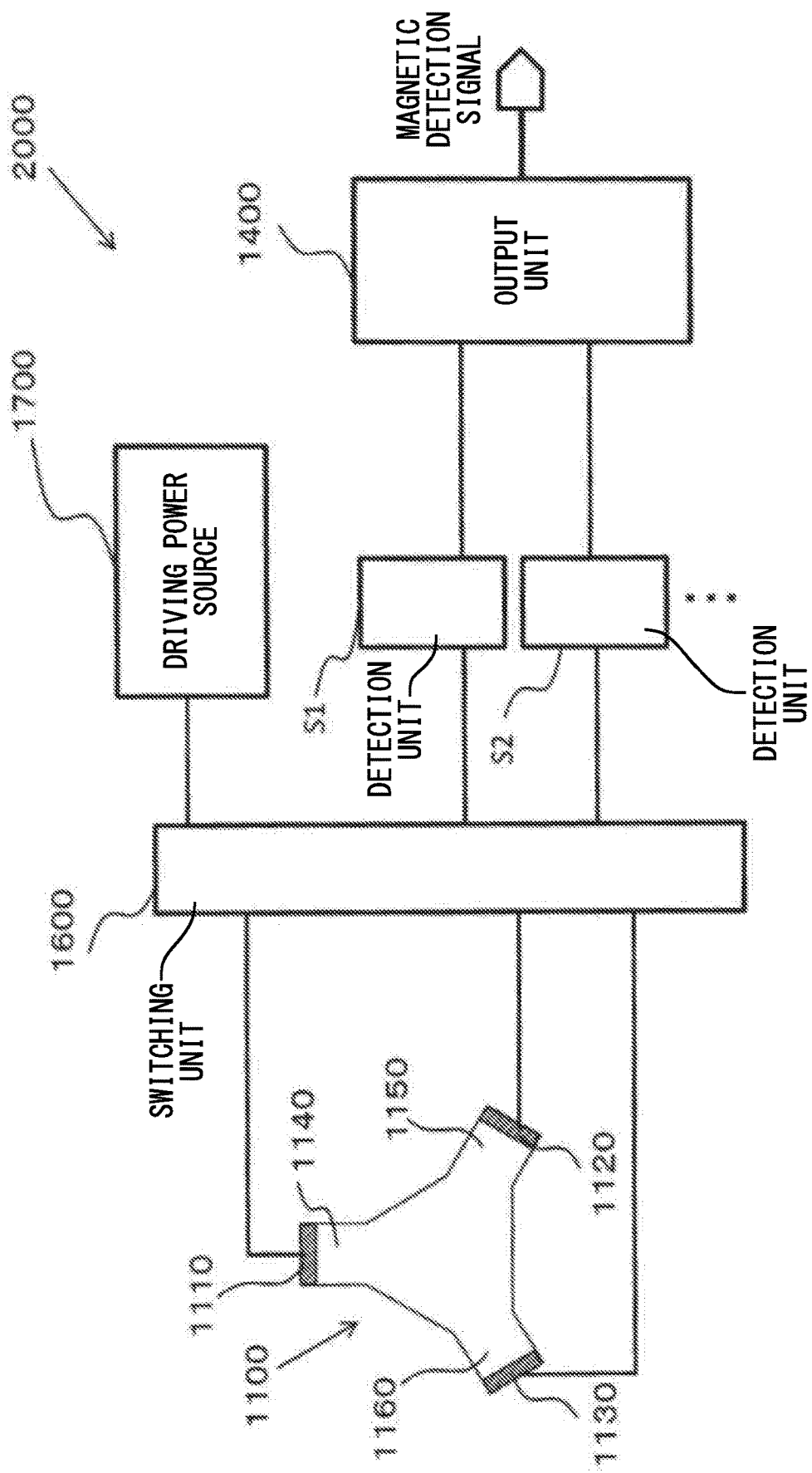
FIG. 20 shows a magnetic detection apparatus 2000 in the present embodiment.

FIG. 20 shows a magnetic detection apparatus 2000 of another example in the present embodiment. The magnetic detection apparatus 200 performs magnetic detection by detecting currents of two sense terminals. The magnetic detection apparatus 2000 includes a driving power source 1700. The magnetic detection apparatus 2000 may include a configuration similar to the magnetic detection apparatus 1000 as another configuration. However, the magnetic detection apparatus 2000 may not have current sources connected to the detection units S1, S2. In the following description, configurations different from those of the magnetic detection apparatus 1000 are explained mainly.

The driving power source 1700 is connected to the switching unit 1600, and is connected to the drive terminal of the magnetic sensing unit 1100 through the switching unit 1600. The driving power source 1700 supplies a driving current to the drive terminal for example at a constant voltage.

The detection units S1, S2 are connected to two sense terminals of the magnetic sensing unit 1100, respectively, through the switching unit 1600 and detect currents output from the two sense terminals. The detection units S1, S2 may be galvanometers.

The output unit 1400 is connected to the detection units S1, S2, and outputs a magnetic detection signal corresponding to a difference between a current on one side of two sense terminals of the magnetic sensing unit 1100 and a current on the other side of the two sense terminals of the magnetic sensing unit 1100.

The magnetic detection apparatus 2000 can perform magnetic detection in a similar manner to magnetic detection by chopping-driving using the magnetic detection apparatus 1000. The switching unit 1600 switches the connection relationship between the terminals 1110, 1120, 1130 and the detection units S1, S2, and the driving power source 1700 supplies a driving current to the drive terminal of the magnetic sensing unit 1100 to perform chopping-driving as shown in (a) to (c) in FIG. 13. The detection units S1, S2 detect currents from sense terminals of the magnetic sensing unit 1100, and the output unit 1400 outputs a magnetic detection signal according to a difference between the detected currents. In the present embodiment, for example by summing up current differences indicated by magnetic detection signals output from the output unit 1400 multiple times, and so on, offset differences of the detection units S1, S2, and the like can be eliminated from a magnetic detection result.

In magnetic detection by chopping-driving using the magnetic detection apparatuses 1000, 2000, output may be performed once or repeatedly for each of a plurality of phases (conditions). Also, in magnetic detection, output may be performed at a plurality of phases repeatedly, and the magnetic detection may be performed to acquire outputs randomly, spending a sufficiently long time. Also, the direction of current in the magnetic sensing unit 1100 may be from the drive terminal to sense terminals, or may be from sense terminals to the drive terminal.

While the embodiment(s) of the present invention has (have) been described, the technical scope of the invention is not limited to the above described embodiment(s). It is apparent to persons skilled in the art that various alterations and improvements can be added to the above-described embodiment(s). It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A magnetic detection apparatus comprising:
    a magnetic sensing unit having a first terminal, a second terminal and a third terminal;
    an output unit that outputs magnetic detection signals of a plurality of phases based on outputs from two terminals that are among the first terminal, second terminal and third terminal of the magnetic sensing unit and are used as sense terminals; and
    a switching unit that performs switching to select any of the terminals of the magnetic sensing unit that is to be connected to the output unit,
    wherein the output unit outputs, as the magnetic detection signals of the plurality of phases, the magnetic detection signals based on at least: a first output difference between the first terminal and the second terminal that is obtained if the first terminal and the second terminal are used as the two sense terminals; a second output difference between the second terminal and the third terminal that is obtained if the second terminal and the third terminal are used as the two sense terminals; and a third output difference between the third terminal and the first terminal that is obtained if the third terminal and the first terminal are used as the two sense terminals, and
    the magnetic detection apparatus is configured to obtain a magnetic detection result by summing the magnetic detection signals of the plurality of phases.

2. The magnetic detection apparatus according to claim 1, comprising the magnetic sensing unit, wherein
    the magnetic sensing unit:
        is formed integrally; and
        has:
            a first extending unit extending to the first terminal and
            a second extending unit extending to the second terminal.

3. The magnetic detection apparatus according to claim 2, wherein
    the magnetic sensing unit has a trifurcate shape,
    the first extending unit is provided to a first branch portion of the trifurcate shape,
    the second extending unit is provided to a second branch portion of the trifurcate shape, and
    the third terminal is provided to a third extending portion extending at a third branch portion of the trifurcate shape.

4. The magnetic detection apparatus according to claim 1, wherein
    the magnetic sensing unit is formed in a semiconductor substrate,
    respective sides constituting outer circumference of the magnetic sensing unit are provided in cleavage directions of a (111) plane of the semiconductor substrate.

5. The magnetic detection apparatus according to claim 1, wherein the switching unit performs the switching at a chopper frequency.

6. The magnetic detection apparatus according to claim 1, comprising:
    a first current source connected to a first sense terminal among the two sense terminals; and
    a second current source connected to a second sense terminal among the two sense terminals, wherein
    the output unit outputs a magnetic detection signal corresponding to a difference between a voltage of the first sense terminal side of the magnetic sensing unit and a voltage of the second sense terminal side of the magnetic sensing unit.

7. The magnetic detection apparatus according to claim 6, wherein the first current source and the second current source perform adjustment such that a current to be caused to flow between the first current source and the magnetic sensing unit and a current to be caused to flow between the second current source and the magnetic sensing unit are made close to each other.

8. The magnetic detection apparatus according to claim 6, wherein the first current source and the second current source are constituted by a current mirror circuit.

9. The magnetic detection apparatus according to claim 1, comprising:
   a driving power source connected to the magnetic sensing unit, wherein
   the output unit outputs a magnetic detection signal corresponding to a difference between a current on one side of the two sense terminals of the magnetic sensing unit and a current on the other side of the two sense terminals of the magnetic sensing unit.

* * * * *